United States Patent [19]

Pellon

[11] Patent Number: 5,673,044
[45] Date of Patent: Sep. 30, 1997

[54] CASCADED RECURSIVE TRANSVERSAL FILTER FOR SIGMA-DELTA MODULATORS

[75] Inventor: Leopold Ernest Pellon, Mt. Holly, N.J.

[73] Assignee: Lockheed Martin Corporation, Moorestown, N.J.

[21] Appl. No.: 593,209

[22] Filed: Jan. 29, 1996

Related U.S. Application Data

[63] Continuation-in-part of Ser. No. 519,593, Aug. 24, 1995, Pat. No. 5,608,400.

[51] Int. Cl.$^6$ .................................................. H03M 3/00
[52] U.S. Cl. ................................................................. 341/143
[58] Field of Search ............................. 341/143, 155; 364/178, 180, 724.1, 724.17

[56] References Cited

U.S. PATENT DOCUMENTS

| | | | |
|---|---|---|---|
| 5,392,042 | 2/1995 | Pellon | 341/143 |
| 5,442,353 | 8/1995 | Jackson | 341/143 |

Primary Examiner—Brian K. Young
Attorney, Agent, or Firm—W. H. Meise; C. A. Nieves; S. A. Young

[57] ABSTRACT

The loop filter of a sigma-delta analog-to-digital converter (ADC) includes a multistage loop filter coupled to the output port of an input summer stage, for receiving difference signals therefrom. The loop filter includes a plurality of cascaded stages. All but one of the cascaded stages includes first and second cascaded half-stages, and that one of the stages includes at least one half-stage. The last one of the cascaded half-stages in the loop filter is coupled to the input port of an ADC stage for coupling loop-filtered difference signals or resonated signals thereto. The ADC stage produces the desired output digital signals. A DAC is coupled to the output of the ADC stage, for generating an analog replica of the desired digital output signals, and for coupling the replica to the input summer stage for aiding in generating the difference signals.

5 Claims, 14 Drawing Sheets

| | To Output y dB (Primary) | INTERMEDIATE NODAL TRANSFER GAINS (dB) | | | | |
|---|---|---|---|---|---|---|
| | | 1 (Δ) | 2 (d₁) | 3 (n₁) | 4 (d₂) | 5 (n₂) |
| Transfer Gain Between Signal Input, x and Node | -0.0002 | -72.0183 | -40.7718 | -36.8773 | 5.6632 | -0.0002 |
| Transfer Gain of Noise added at Node and Output | -72.0183 | -0.0002 | -29.4447 | -33.4543 | -77.6748 | -72.0183 |

*Fig. 9c*

| COEFFICEINT | IIR VALUES | dB VALUES OF IIR WEIGHTS |
|---|---|---|
| A11, A12, A13 = | -3.2712  -3.6866  -2.0136 | 10.294dB, 11.33dB, 6.079dB |
| A21, A22 = | 1.0000  0.48282 | 0dB, -6.329dB |
| B11, B12 = | -1.9588  -1.0000 | 5.8398dB, 0dB |
| B21, B22 = | -1.9929  -1.0000 | 5.9897dB, 0dB |

CASCADED RECURSIVE TRANSVERSAL FILTER FOR SIGMA-DELTA MODULATORS

CROSS-REFERENCE TO RELATED APPLICATIONS

This is a continuation-in-part of Ser. No. 08/519,593, filed Aug. 24, 1995, now U.S. Pat. No. 5,608,400 in the name of Pellon.

FIELD OF THE INVENTION

This invention relates to analog-to-digital converters, and more particularly to sigma-delta ($\Sigma\Delta$) analog-to-digital converters in which the loop filter includes a cascade of recursive transversal filter stages which provide reduced sensitivity to loop gain and phase errors.

BACKGROUND OF THE INVENTION

Analog-to-digital converters are widely used for converting sensed analog signals into digital form, so that the signals may be processed for further use by reliable and repeatable digital circuits. There are many different types of analog-to-digital converters, including flash converters, subranging converters, and successive-approximation types. One particularly advantageous type of analog-to-digital converter is the sigma-delta ($\Sigma\Delta$) converter, which provides relatively high resolution and high speed, in a structure with relatively low tolerances.

Prior-art sigma-delta ($\Sigma\Delta$) analog-to-digital converters include a summing circuit which compares the analog input signal with an analog replica of the desired digital output circuit to produce a difference signal. The difference signal is applied through a loop filter (to attenuate quantization noise) to an analog-to-digital converter stage, which generates the desired digital output signal. A recursive transversal loop filter may be used in a sigma-delta analog-to-digital converter, as described in U.S. Pat. No. 5,392,042, issued Feb. 21, 1995 in the name of Pellon. Such a recursive transversal loop filter has the advantage of improved selectability of the loop poles and zeroes, together with elimination of integrators. The recursive transversal loop filter may be implemented with continuous-time delays when operated at high sampling rates. Typically, a prior-art recursive transversal filter as used in a sigma-delta analog-to-digital converter can provide up to about 40 dB of noise shaping in the presence of unavoidable gain and phase errors of the regenerative portions of the recursive transversal filters. Higher attenuation in the presence of gain and phase errors may be desired.

SUMMARY OF THE INVENTION

According to an aspect of the invention, the loop filter of a sigma-delta analog-to-digital converter includes a multistage loop filter coupled to the output port of an input summer stage, for receiving difference signals therefrom. The loop filter includes a plurality of cascaded recursive filter transversal (RTF) stages. All but one of the cascaded filter stages includes first and second cascaded half-stages of filtering, and the one of the cascaded filter stages includes at least one half-stage. The last one of the cascaded half-stages in the loop filter is coupled to the input port of an analog-to-digital converter stage for coupling loop-filtered difference signals thereto. The analog-to-digital converter stage produces the desired output digital signals. A digital-to-analog converter is coupled to the output of the analog-to-digital converter stage, for generating an analog replica of the desired digital output signals, and for coupling the analog replica to the input summer stage for aiding in generating the difference signals. Each of the first half-stages of filter includes an input summing circuit including an output port, and also includes an input port coupled for receiving signal to be filtered from a preceding stage, for summing the signal to be filtered with at least one weighted, delayed signal fed back from the output port of the input summing circuit, for thereby generating resonated signals at the output port of the input summing circuit. Each of the second half-stages includes an output summing circuit including at least two input ports coupled to receive mutually delayed signals from a preceding stage, for summing the mutually delayed signals.

More particularly, a sigma-delta analog-to-digital converter according to an aspect of the invention includes an output port at which the desired digital signals are generated. The sigma-delta analog-to-digital converter comprises an input summing circuit including a noninverting input port for receiving analog signals to be converted into digital form, and an inverting input port for receiving analog replicas of, or reconstructed digital signals, for taking the difference therebetween for producing difference signals. A digital-to-analog converter stage is coupled to the output port of the sigma-delta analog-to-digital converter and to the inverting input port of the input summing circuit, for converting the desired digital signals into the reconstructed digital signals. A loop filter is coupled to an output of the input summing circuit for filtering the difference signals with a frequency characteristic which includes N gain poles and N−1 gain zeroes, where N is an integer greater than one, to produce a resonated analog signal. The loop filter further includes a cascade of a plurality M of feedback network stages, where M is greater than one, and P feedforward network stages, where P is at least one. Each of the feedback network stages comprises a summer with a main input port and a summed signal output port, for receiving processed signal at the main input port from a preceding stage, and for, in the ith feedback stage, summing the processed signal with $N_i$ weighted, delayed versions of the signal appearing at the summed output port, where the sum of all $N_i$ for all stages equals N. Each of the feedforward network stages comprising a summer including a plurality of input ports and a summed signal output port, for, in the jth feedforward stage, receiving $L_j$ plural mutually delayed and weighted versions of processed signals from a preceding stage, and for summing together the $L_j$ mutually delayed and weighted versions in a feedforward manner, where the sum of all $L_j$ for all feedforward stages equals N−1. An analog-to-digital converter is coupled to the loop filter and to the output port of the sigma-delta analog-to-digital converter, for converting the resonated analog signal into the desired digital signals at the output port of the sigma-delta analog-to-digital converter.

BRIEF DESCRIPTION OF THE DRAWINGS

FIG. 5b is a portion of FIG. 5a, and FIG. 5c is the phase response corresponding to the plot of FIG. 5a;

FIG. 10 tabulates coefficient values for a preferred embodiment of the invention.

DESCRIPTION OF THE INVENTION

Figure 1:
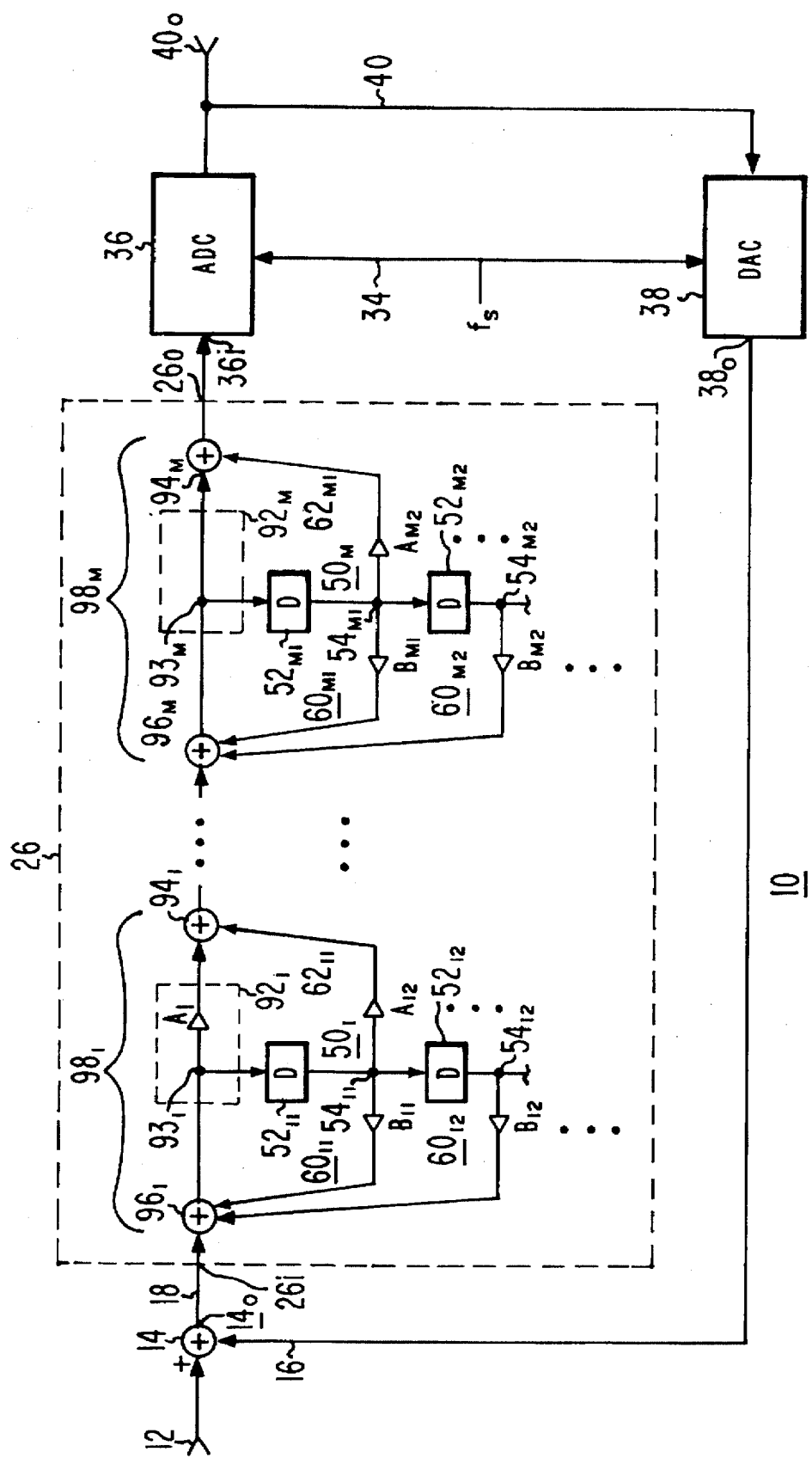
FIG. 1 is a simplified block diagram of a sigma-delta analog-to-digital converter according to the invention, including a loop filter with cascaded sections.

In FIG. 1, a sigma-delta ($\Sigma\Delta$) analog-to-digital converter 10 includes an input port 12. Analog signals to be converted into digital form are applied by way of input port 12 to a summing circuit 14. Summing circuit 14 also receives an analog replica of the digitized input signal over a path 16. The loop phase is established in conjunction with the inverting or noninverting nature of the input ports of summing circuit 14 so that a difference ($\Delta$) signal is generated by summing circuit 14 on signal path 18. Thus, if the replica of the output digital signal applied over signal path 16 is in-phase with the analog input signal applied to input port 12, summing circuit 14 takes the difference between the two signals. The difference signal on signal path 18 is applied to the input port 26i of a loop filter 26, and the filtered difference signal at output port 26o is applied to an analog-to-digital converter block 36. Analog-to-digital converter (ADC) block 36 converts the filtered difference signal to digital form at a frequency or rate established by a clock signal $f_s$ applied to ADC 36 by way of a clock signal path 34, and the desired digitized signal appears at output port $40_o$. A feedback path extends from output port $40_o$ back to summing circuit 14. The feedback path includes a signal path 40, and a digital-to-analog converter (DAC) 38, which operates at clock rate $f_s$, and generates at its output port $38_o$ the analog replica of the digitized output signal. The analog replica of the digitized output signal is applied from the output port $38_o$ of DAC 38 over a signal path 16 to summing circuit 14, as described above, in order to generate the difference signal.

According to an aspect of the invention, the loop filter of the arrangement of FIG. 1 includes a plurality of cascaded recursive transversal filters (RTFs) or filter stages. For this purpose, a recursive filter is one in which feedback is used, so that the current filter output is a function of prior filter outputs as well as of filter inputs. In FIG. 1, the cascaded filters are designated $98_1, \ldots, 98_M$, where the dotted lines represent additional cascaded filter stages which are not illustrated. Each recursive transversal filter stage $98_1, \ldots, 98_M$ includes an input summing circuit $96_i$, where the subscript i represents the particular one of the M cascaded stages. Each input summing circuit $96_i$ receives the output signal from the preceding one of the cascaded filters, except that the input summing circuit $96_1$ of the first filter $98_1$ receives the difference signal from summing circuit 14. Each recursive transversal filter stage $98_1, \ldots, 98_M$ also includes an output summing circuit $94_i$; thus, recursive transversal filter $98_1$ has an output summing circuit $94_1, \ldots$, and the last recursive transversal filter $98_M$ has an output summing circuit $94_M$, which is also the same as, or corresponds to, output port $26_o$ of the loop filter 26.

Within each recursive transversal filter $98_1, \ldots, 98_M$ of FIG. 1, a coupling and weighting circuit 92 couples the output of the input summing circuit $96_i$ to the input of the corresponding output summing circuit $94_i$. For example, the output port of input summing circuit $96_1$ of first recursive transversal filter $98_1$ is coupled to the input port of output summing circuit $94_1$ by a coupling or weighting-and-sampling circuit $92_1$. Similarly, the output port of input summing circuit $96_M$ of last recursive transversal filter $98_M$ is coupled to the input port of output summing circuit $94_M$ by a coupling circuit $92_M$. Each weighting and sampling circuit $92_i$ includes a tap point $93_i$. Within each weighting and sampling circuit 92, the tap or sampling point 93 may precede or follow the weighting A, or there may be a weighting value of unity, which is in effect no weighting whatever. The sampling or tap point is indicated by a circle or dot $93_1$ within weighting and sampling circuit $92_1$, and is designated $93_M$ within weighting and sampling circuit $92_M$.

Also, each recursive transversal filter stage $98_1, \ldots, 98_M$ of FIG. 1 includes a tapped delay (D) designated generally as $50_i$. Thus, recursive transversal filter $98_1$ has a tapped delay $50_1$, which includes a first delay section $52_{11}$ with an output tap point $54_{11}$, and also includes a second delay section $52_{12}$ with an output tap point $54_{12}$. Similarly, recursive transversal filter $98_M$ has a tapped delay section $50_M$, which includes a first delay section $52_{M1}$ with an output tap point $54_{M1}$, and a second delay section $52_{M2}$ with an output tap point $54_{M2}$. Further, each recursive transversal filter $98_1, \ldots, 98_M$ of FIG. 1 also includes feedback and feedforward paths associated with the taps of the delay sections. Thus, a first feedback path $60_{11}$ extends from delay tap $54_{11}$ back to an input port of summing circuit $96_1$ by way of a weighting circuit $B_{11}$, and a second feedback circuit $60_{12}$ extends from delay tap $54_{12}$ back to input summing circuit $96_1$ by way of a weighting circuit $B_{12}$. A feedforward path $62_{11}$ extends from delay tap $54_{11}$ to output summing circuit $94_1$ by way of a weighting circuit $A_{12}$. Similarly, a first feedback path $60_{M1}$ extends from delay tap $54_{M1}$ of $M^{th}$ transversal filter $98_M$ back to summing circuit $96_M$ by way of a weighting circuit $B_{M1}$, and a second feedback circuit $60_{M2}$ extends from delay tap $54_{M2}$ back to input summing circuit $96_M$ by way of a weighting circuit $B_{M2}$. A feedforward path $62_{M1}$ extends from delay tap $54_{M1}$ to output summing circuit $94_M$ by way of a weighting circuit $A_{M2}$.

As suggested by the dotted lines associated with the delay sections $50_i$ and the weighting circuits A and B of FIG. 1, each filter section 98 of the cascade of loop filter 26 of FIG. 1 may include additional delays D interconnected with additional weighting circuits to produce additional feedback and feedforward loops.

Figure 2:
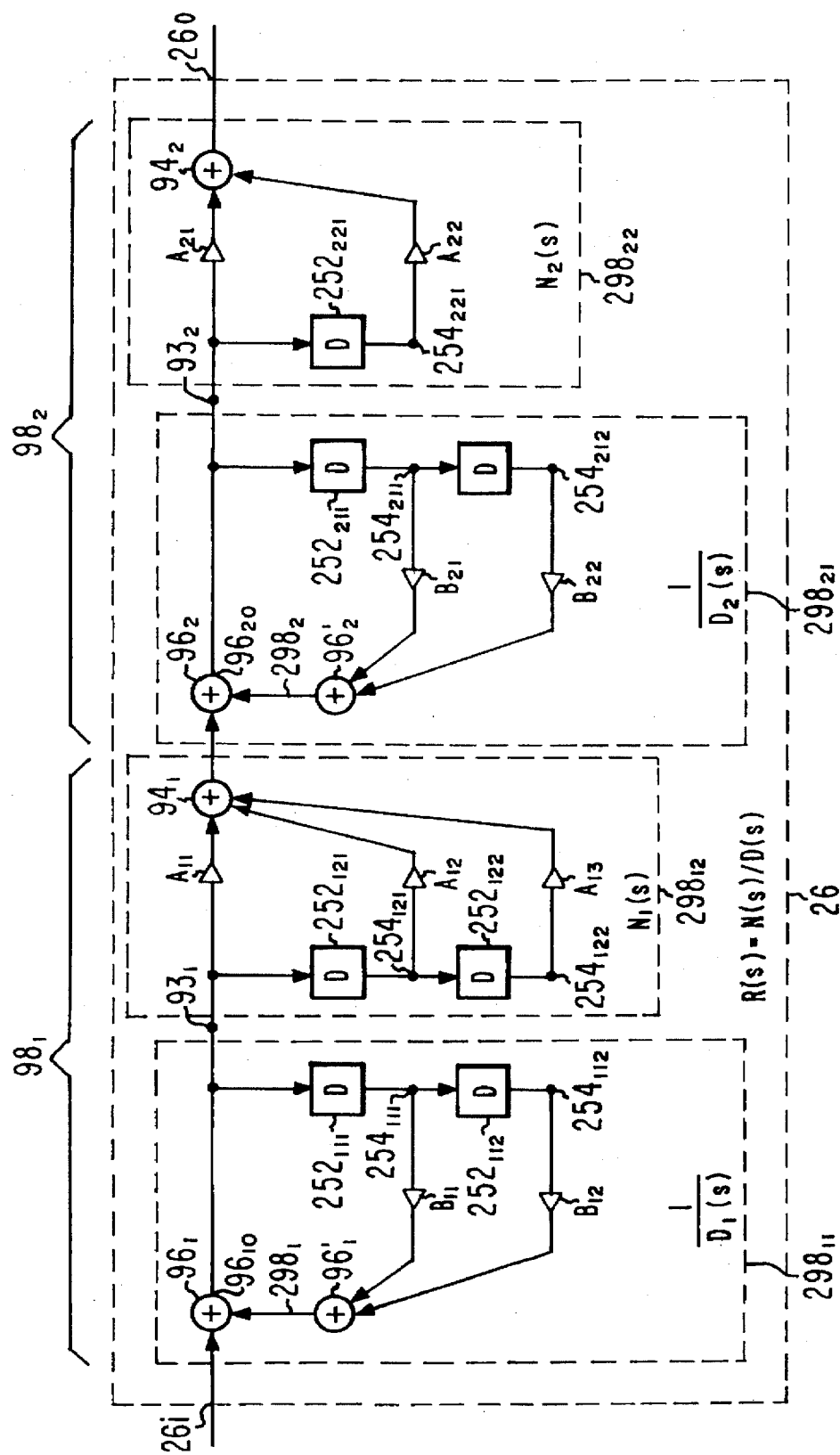
FIG. 2 is a simplified block diagram of the loop filter of FIG. 1, with a portion of the loop filter decomposed into its constituent parts, in order to illustrate that the feedback and feedforward loops are analytically separable.

FIG. 2 is similar to the loop filter 26 of FIG. 1, but with only two filter sections $98_1$ and $98_2$, and with the feedback and feedforward portions of filter sections $98_1$ and $98_2$ decomposed, for analytic purposes, into completely separate paths or half-filters, by splitting the delays into two parallel portions. In FIG. 2, elements corresponding to those of FIG. 1 are designated by like reference numbers, except that the M subscripts of FIG. 1 are now subscript 2, representing the second, rather than the Mth, section. Filter section $98_1$ is divided into a first half-filter $298_{11}$ and a second half-filter $298_{12}$, and filter section $98_2$ is also divided into first and second half-filters $298_{21}$ and $298_{22}$. Delay $52_{11}$ of FIG. 1 has been decomposed into two separate delays $252_{111}$, $252_{112}$, and delay $52_{12}$ has been similarly decomposed into two separate delays $252_{112}$ and $252_{122}$. The delays of delay segments $252_{111}$ and $252_{112}$ are identical, because each section has "itself" as a mate, and the delays of delay segments $252_{112}$ and $252_{122}$ are identical for the same reason. Delay section $252_{111}$ of half-filter $298_{11}$ is cascaded with delay section $252_{112}$, with a tap point $254_{111}$ therebetween. Similarly, second filter section $98_2$ has its decomposed delays $252_{111}$ and $252_{221}$ in half-filters $298_{21}$ and $298_{22}$, respectively. Delay $252_{211}$ is cascaded with a delay section $252_{212}$, and has a tap point $254_{211}$ therebetween. A similar tap point $254_{121}$ lies between delay sections $252_{121}$ and $252_{122}$ of half-filter $298_{12}$. Tap point $254_{111}$ is connected to the input of a feedback weighting circuit $B_{11}$, the output of which is coupled to an input port of an adder designated $96_1'$, and tap point $254_{112}$ is connected to the input of a feedback weighting circuit $B_{12}$, which is also coupled to an input of adder $96_1'$. Adder $96_1'$ as illustrated is a two-input, single-output adder, which is connected to an input of adder $96_1$ by a signal path $298_1$. Instead of using two adders $96_1$ and $96_1'$, a single three-input-port adder could be used. The presence of two adders provides for path $298_1$ common to all the feedback paths of the stage, which may be advantageous, as described below. This decomposition of filter sections into feedback and feedforward portions is useful for analytical purposes, but it should be recognized that, in a practical embodiment, the delays should be combined.

Filter half-section $298_{12}$ of FIG. 2 has a delay section $252_{121}$ coupled to tap point $93_1$, and a further delay section $252_{122}$ coupled to delay section $252_{121}$ at a tap point $254_{121}$. Tap point $93_1$ is coupled to a first input port of output summing circuit $94_1$ of filter $98_1$ by a first weighting circuit $A_{11}$, tap point $93_1$ is coupled to a second input port of output summing circuit $94_1$ by way of delay section $252_{121}$ and a feedforward weighting circuit $A_{12}$, and tap point $93_1$ is coupled to a third input port of output summing circuit $94_1$ by way of delay sections $252_{121}$ and $252_{122}$, tap point $254_{122}$, and feedforward weighting circuit $A_{13}$. Thus, summing circuit $94_1$ receives three weighted, mutually delayed signals originating from tap point $93_1$. Similarly, filter half-section $298_{22}$ of FIG. 2 couples signal from a tap point $93_2$ to a first input port of output summing circuit $94_2$ by way of a first weighting circuit $A_{21}$, and to a second input port of summing circuit $94_2$ by way of delay section $252_{221}$, tap point $254_{221}$, and a weighting circuit $A_{22}$. Thus, output summing circuit $94_2$ of half-filter section $298_{22}$ of second filter $98_2$ receives undelayed weighted signal and relatively delayed weighted signal from tap point $93_2$.

The two-stage loop filter 26 of FIG. 2 has two feedback loops $B_{11}$, $B_{12}$ associated with first filter half-section $298_{11}$, and two feedback loops $B_{21}$, $B_{22}$ associated with second filter half-section $298_{21}$. The two-stage loop filter 26 of FIG. 2 also has two feedforward loops $A_{12}$, $A_{13}$ associated with filter half-section $298_{12}$, but only one feedforward loop $A_{22}$ associated with filter half-section $298_{22}$. The loop filter of FIG. 2, according to an aspect of the invention, has one less total number of feedforward loops (not including the main path) than the total number of feedback paths. More particularly, half-filter $298_{11}$ has two feedback paths including the paths with weights $B_{11}$ and $B_{12}$, and half-filter $298_{21}$ has two feedback paths including the paths with weights $B_{21}$ and $B_{22}$. Also, half-filter $298_{12}$ has two feedforward paths including paths with weights $A_{12}$ and $A_{13}$, but the main signal path including weight $A_{11}$ is not counted. Half-filter $298_{12}$ has one feedforward path with weight $A_{22}$, but the main signal path including weight $A_{21}$ is not counted. Thus, the entire two-stage cascaded loop filter 26 of FIG. 2 is determined to be of an order equal to the number of feedback paths, which totals four. In general, the order of the entire loop filter is N, which is equal to the total number of feedback paths in the loop filter, and the total number of feedforward paths is N−1. Referring specifically to the arrangement of FIG. 2, the order N is established as 4, because there are four feedback paths as described above, and the number of feedforward paths, in accordance with the invention, is therefore three. It is important to note that the locations of the feedforward paths are essentially irrelevant (although there are preferred locations), in that half-filter $298_{22}$ could be eliminated, so long as one further feedforward loop were added to half-filter $298_{12}$. Similarly, half-filter $298_{12}$ could be eliminated, so long as two further feedforward loops were added to half-filter $298_{22}$. Also, the locations of the N feedback loops is essentially irrelevant (although there are preferred locations), so that, in principle, all four feedback paths could be associated with half-filter $298_{11}$, and half-filter $298_{11}$ could be eliminated; however, this reduces the advantage (described below) achieved by cascading of filter sections. It should also be noted that, since half-filter $298_{22}$ can be eliminated from the loop filter of FIG. 2 by moving its associated feedforward path to another half-section, it is not necessary that a loop filter according to the invention have an even or odd number of half-filters, both are possible.

Figure 3:
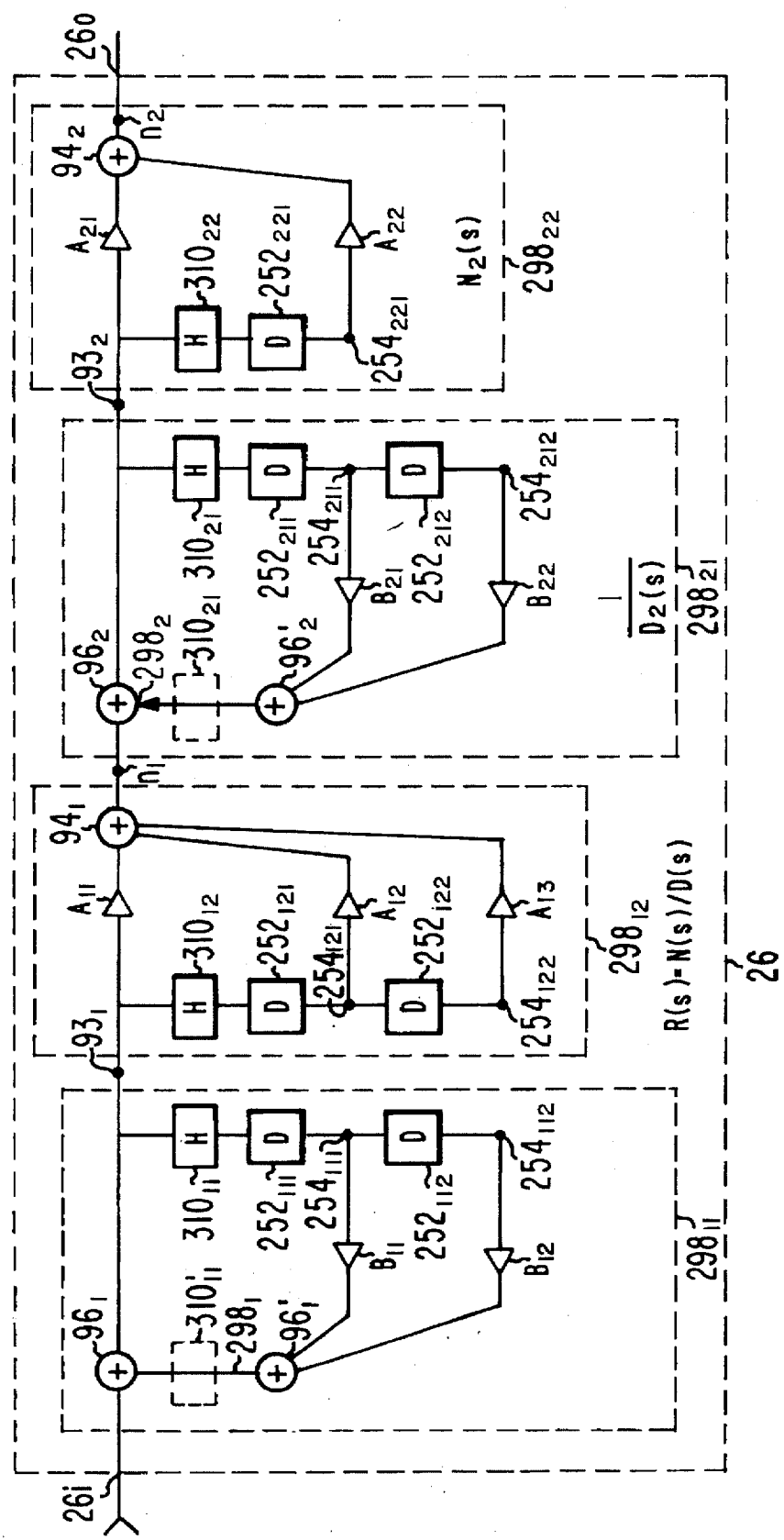
FIG. 3 is a simplified block diagram of the loop filter of FIG. 2, illustrating the filters which are desirably used in conjunction with continuous-time delays.

The arrangement of FIGS. 1 and 2 is conceptually applicable to either discrete-time or continuous-time filters. FIG. 3 is a simplified block diagram of a loop filter similar to that of FIG. 2, with the addition of band-limiting filters H in the delay paths for the case in which the loop filter is continuous-time. Filters $310_{11}$, $310_{12}$, $310_{21}$, $310_{22}$ are coupled in cascade with delays $252_{111}$, $252_{121}$, $252_{211}$, and $252_{221}$, respectively, to suppress loop filter resonances above the Nyquist frequency while maintaining sufficient linear phase, all for stability, as described in the abovementioned Pellon application. Also, as described therein, an equalizing filter (not illustrated) is desirably placed within the sigma-delta feedback loop when the filter is continuous-time. As illustrated in FIG. 3, filters $310_{11}$, $310_{12}$, $310_{21}$, and $310_{22}$ are each in series with all the feedback or feedforward paths of the particular half-filter in which they are found. It should be noted that the use of adders such as $96_1'$ provides a signal path such as $298_1$ which is also in series with all the feedback paths of half-filter $298_{11}$, and filter $310_{11}$ may instead be placed in dash-line location $310_{11}'$, whereupon it is still in series with all the feedback paths of the first half-filter. Similarly, filter $310_{21}$ may be placed at dash-line location $310_{21}'$ instead of its illustrated location, and will be in series with all the feedback paths of half-filter $298_{21}$. In a like manner, the filters $310_{12}$ and $310_{22}$ may be placed at alternate locations if additional adders are provided in the feedforward paths. Since the filters $310_i$ may be placed at either of two locations in each half-filter, they may also be distributed, with a portion of the filtering at one of the locations, and a further portion at the other location.

In operation, the arrangement of FIGS. 1, 2 or 3, with the order selected as described in conjunction with FIG. 2, provides superior attenuation of quantization noise in the presence of gain and phase errors, by virtue of the cascading of the filter sections. The selection of the locations of the poles of the loop filter is accomplished in the same manner as for prior art loop filters. However, the cascaded implementation provides improved attenuation of quantization noise in the presence of the unavoidable errors in gain and phase of the various components which make up the filter. This may be understood by considering that each half-stage of the loop filter produces its own distortion, because of nonlinearity of the active components. Thus, the last half-section of the filter (half-section $298_{22}$ of FIG. 2, for example) produces its own error signal, which may be viewed as being added to (or at) the input of the half-section. Those half-stages of the loop filter which precede the last half-section may therefore be viewed as shaping the noise contribution of the last half-section, and thereby shaping the noise contribution to the loop filter output and therefore at the digitized output of the sigma-delta analog-to-digital converter. The same view can be applied in succession to each of the filter half-stages preceding the last half-section. A cascade of several half-sections, then, provides more filtering or shaping of the noise contribution of the last half-section. Additionally, the transfer of the input signal from port 12 of FIG. 1 to the input of the last half-filter is shaped to modify the amplitude of the signal. Thus, a cascade of sections can provide lower noise in the overall sigma-delta analog-to-digital converter 10. Also, all filter stages except the last stage may operate at relatively low signal level, and have improved dynamic range, by comparison with noncascaded stages of loop filter.

It should be noted that, if the number of cascaded stages is reduced to one in the arrangement of FIGS. 2 or 3, corresponding to a cascade of two half-sections of filter, the structure is similar to that described in the abovementioned U.S. Pat. No. 5,392,042, and there is but one half-stage of filtering or shaping preceding the output half-stage of filtering. Consequently, the arrangement according to the invention may provide improved noise performance by comparison with the arrangement of U.S. Pat. No. 5,392,042 for the same number of poles.

Figure 4A:
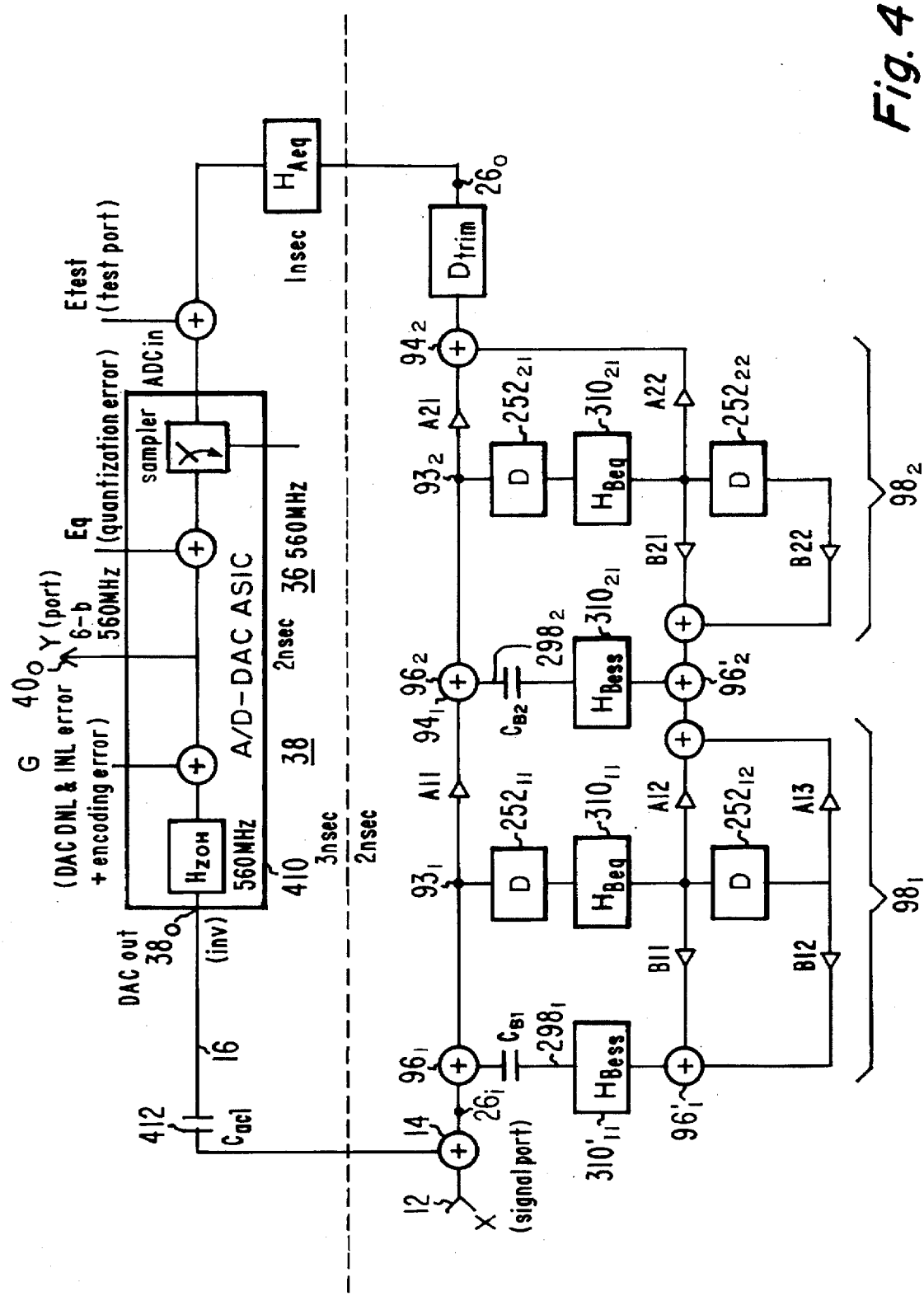
FIG. 4a is a signal-flow graph.
Figure 4B:
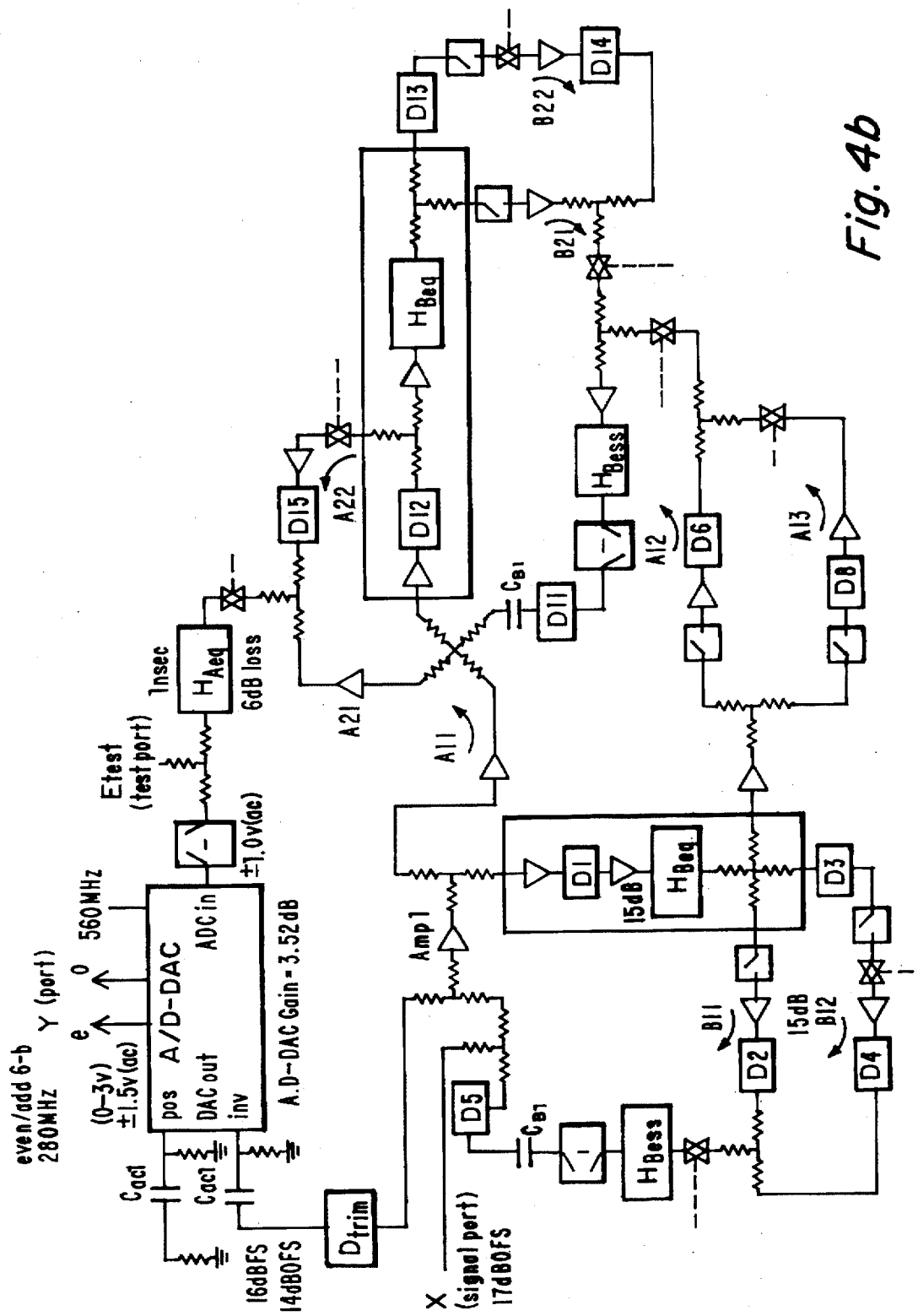
FIG. 4b is a hardware block diagram of a four-pole embodiment of the invention, corresponding to the block diagram of FIG. 3.
Figure 4C:
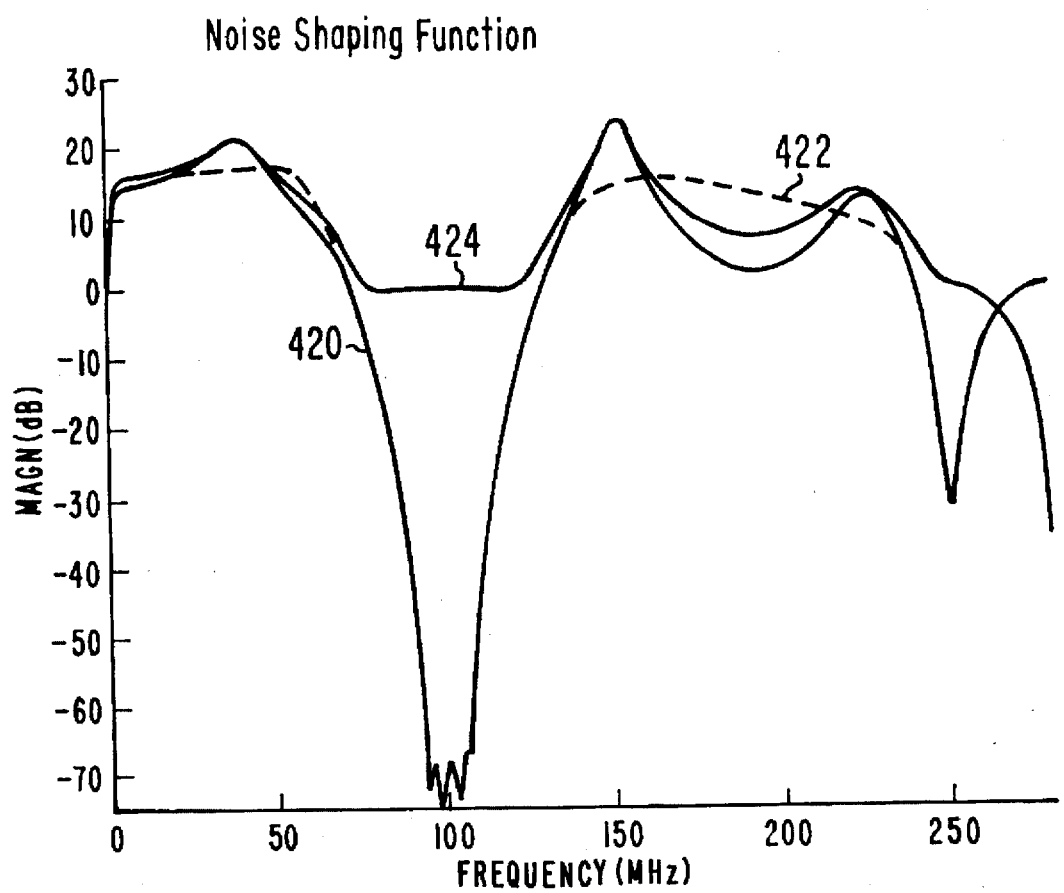
FIG. 4c illustrates frequency performance.

FIG. 4a is a simplified signal-flow diagram of a four-pole embodiment of the invention, and FIG. 4b is a simplified hardware block diagram. In FIG. 4a, elements corresponding to those of FIGS. 1 or 3 are designated by like reference numerals. In FIG. 4a, ADC 36 and DAC 38 are combined into a single special-purpose integrated circuit 410. A DC-blocking capacitor 412 is coupled in signal path 16, and another in signal path 298, and a third in signal path $298_2$. FIG. 4b illustrates a hardware implementation of the $\Sigma\Delta$ analog-to-digital converter. FIG. 4c includes a plot 420 of the closed-loop noise shaping function, which is the quantization noise added by ADC 36 of FIG. 1, and affected by the entire loop. Plot 422 represents the same transfer function with the ADC and DAC replaced with a simple signal path (continuous-time path without aliasing).

The cascaded RTF structure reduces the sensitivity of the attenuation region of the quantization noise shaping function to errors in the settings of gain and phase weights. The ability to reduce the operating level while preserving very low RTF noise is also desired. The cascaded architecture achieves these goals as a result of the multiplication of errors in each of the cascaded B loops with the composite attenuating transfer functions produced by the other loops. Assuming 1% random peak to peak errors (0.01), the cascading achieves approximately the same attenuation using only 2 stages as the single-stage arrangement when the error is 0.01% (0.0001). In the two-stage cascaded case with a 0 dB input signal level, the modulator develops a −65 dB $\Delta$ signal at the RTF input after the adder. The RFT performs integration over the pass band to produce effectively a 0 dB signal at the digital output. When cascaded, the signal is integrated in two or more stages of regenerative gain, typically in the range of 30 to 40 dB each. Additionally, error signals that are equivalently added after the integration stage, but before the digital output branch point, are reduced by the action of the preceding stage. As a result, the first stage will have its signal power level reduced by typically −30 dB with respect to the input and output signals of the modulator, but with non-attenuated input equivalent noise. The second stage will operate at a higher signal power level, but its input equivalent noise is reduced by typically 30 dB. Thus, design optimization suggests a lower operating level and low noise front end section for the first RTF stage and a higher operating power, but also higher noise second stage. This allows the multistage RTF to have the noise and dynamic range of a typical intermediate-frequency (IF) amplifier after considering the input stage losses.

The function of the loop filter of the invention, termed the continuous time recursive transversal filter (CRTF), is to implement the function loop filter transfer function, which is the Laplace Transform R(s) for analog continuous-time loop filters and which is the Z Transform R(z) in analog discrete time loop filters. Since the invention of FIG. 1 may employ analog discrete time delays as well as analog continuous time delays, the principles of the following discussion will be made with respect to both. The value of the delay $T_c$ is the transversal delay period employed in the modulator (delays in the tapped delay line employed in FIG. 1). The preferred embodiment of the invention employs continuous-time delays in the loop filter. In the abovementioned parent Pellon application, the principles governing the relationship between continuous-time loop filter transfer functions R(s) and the discrete-time closed loop signal and noise transfer functions of the entire $\Sigma\Delta$ modulator, which are respectively denoted as $H_{xp}(s)$ and $H_{ep}(s)$, are set forth in detail, so that those skilled in the art may determine R(s). In the following discussion, the subscript p denotes frequency periodicity of the transfer function with the sampling frequency $\omega_s$ (in units of radians per second) when s=j$\omega$, whereas the absence of the subscript denotes that the transfer function is not periodic. Additionally, the transfer functions may be described in terms of the Z transform for analog discrete time loop filters. Noting that $z^{-1}=e^{-sT_e}$, the z-transform description may also be used to define idealized continuous-time functions. It is idealized because any true continuous-time system is subject to bandlimiting, so that infinite periodicity in frequency cannot occur. However, the z-transform description may be used to define the response accurately over a range of frequencies. Therefore, the analysis below uses z transforms to describe both analog discrete time loop filtering and idealized continuous time loop filtering. The knowledge of skilled practitioners will make obvious the application of the analysis to nonideal (bandlimited) cases.

The continuous-time noise and signal transfer functions are written as $$H_e(s) = \frac{e^{-sT_e}}{1+R(s)e^{-sT_e}} , H_x(s) = \frac{R(s)e^{-sT_e}}{1+R(s)e^{-sT_e}} \tag{1}$$

respectively. As pertaining to the preferred continuous time embodiment, the distinguishing feature of the invention is that the structure of the CRTF implements R(s) in cascaded sections.

Initially, a discrete time prototype stop band filter $H_D(z)$ is designed in which the assumption $z^{-1}=e^{-sT_e}$ is made. The noise shaping response is then initially defined by a prototype noise shaping function $H_e(z)$ given by $$H_e(z) = \frac{D(z)}{K(z)} = \frac{H_D(z)}{a_o} z^{-1} \quad (2)$$

The stop band filter $H_D(z)$, uses standard IIR or FIR filter design methods to obtain a specified stop band characteristic. The numerator and denominator polynomial coefficients of $H_D(z)$ are defined as $a_i$ and $b_i$, respectively. The prototype weights are mapped from the prototype weights by setting the feedforward resonator coefficients to $A_{ri} = b_i - a_i/a_o$ and the feedback coefficients to $B_{ri} = -a_i/a_o$. The effect of the mapping on the closed loop transfer function is defined by Equation (2) and is characterized by the fact that $a_o$ is less than one. This reduces the attenuation in the stop band of $H_e(z)$ with respect to $H_D(z)$, as described in the above-mentioned U.S. Pat. No. 5,392,042.

For a two-stage cascaded implementation of a fourth order loop filter (N=4), the resonator transfer function R(z) is factored $$R(z) = \frac{N(z)}{D(z)} = \frac{\sum_{i=1}^{N-1} A_{ri} z^{-(i-1)}}{1 - \sum_{i=1}^{N} B_{ri} z^{-1}} = \quad (3)$$

$$\frac{A_{11} - A_{12} z^{-1} A_{13} z^{-2}}{1 - B_{11} z^{-1} - B_{12} z^{-2}} \cdot \frac{A_{21} - A_{22} z^{-1}}{1 - B_{21} z^{-1} - B_{22} z^{-2}}$$

The mapped resonator weights determine the pole and zero locations of the resonator transfer function R(z) so that the pole and zero locations specified by Equation (2) are obtained in the closed loop Sigma-Delta Modulator.

The noise shaping filter can then be written as $$H_e(z) = ([1 - B_{11} z^{-1} - B_{12} z^{-2}] \cdot [1 - B_{21} z^{-1} - B_{22} z^{-2}]) / \quad (4)$$

$$([1 - B_{11} z^{-1} - B_{12} z^{-2}] \cdot [1 - B_{21} z^{-1} - B_{22} z^{-2}] +$$

$$[A_{11} - A_{12} z^{-1} - A_{13} z^{-2}] \cdot [A_{21} - A_{22} z^{-1}] z^{-1})$$

The signal shaping filter can then be written as $$H_x(z) = ([A_{11} - A_{12} z^{-1} - A_{13} z^{-2}] \cdot [A_{21} - A_{22} z^{-1}]) / \quad (5)$$

$$([1 - B_{11} z^{-1} - B_{12} z^{-2}] \cdot [1 - B_{21} z^{-1} - B_{22} z^{-2}] +$$

$$[A_{11} - A_{12} z^{-1} - A_{13} z^{-2}] \cdot [A_{21} - A_{22} z^{-1}] z^{-1})$$

These two transfer functions are related by $H_x(z) = 1 - H_e(z)z$ as in prior art $\Sigma\Delta$ modulators. $H_e(z)$ and $H_x(z)$ also share the same denominator term, denoted as K(z).

The denominator term of R(z) is responsible for producing a zero or near zero response in the noise shaping band of the closed-loop modulator and corresponds to a very high gain in R(z). The denominator of R(z) is given by $$D(z) = D_1(z)D_2(z) = [1 - B_{11} z^{-1} - B_{12} z^{-2}] \cdot [1 - B_{21} z^{-1} - B_{22} z^{-2}] \quad (6)$$

In the presence of error in each coefficient, we say $D_1(z)' = D_1(z) + D_{1e}(z)$ and $D_2(z)' = D_2(z) + D_{2e}(z)$, so that the total is given by $$D(z)' = D(z) + D_{1e}(z)D_2(z) + D_{2e}(z)D_1(z) + D_{1e}(z)D_{2e}(z) \quad (7)$$

For example, a fourth-order binomial weighting design uses weights $Br1=[2,-1]$ and $Br2=[2,-1]$ to form individual second order resonant sections and also uses $Ar1=[2,-2,1]$ and $Ar2=[2,-1]$ to generate the necessary feedforward weighting to produce stability via K(z). The effect of K(z) in the presence of 1% gain errors is small over the pass band, and thus, it is sufficient to observe only the effect of gain errors on D(z).

The prior-art single-stage RTF loop filter produces the open-loop transfer function directly as $$R(z) = \frac{N(z)}{D(z)} \quad (8)$$

where $D(z) = 1 - [B_1 z^{-1} + B_2 z^{-2} \ldots]$.

In the presence of error, the single stage produces $D'(z) = D(z) + D_e(z)$.

Knowing that the noise shaping performance is dominated by $1/D(z)$, the regenerative gain mechanism for R(z) produces high gain regions where $B(z) = B_1 z^{-1} + B_2 z^{-2} + \ldots$ has both a near-unity magnitude response and a phase shift near 0° over the noise shaping band. For example, at DC, the ideal coefficients $B_1 = 2$, $B_2 = -1$ result in $R(s=0) = 1/0 = \infty$, but a 1% peak-to-peak mismatch error of $B_1$ and $B_2$ limits the gain to finite values. At the center of the binomial notch, z=1, and D(z=1) equals zero. Substituting and letting $\epsilon_i$ be an independent random variable with $\sigma_\epsilon = 0.01$, the residues are given by the following calculation of center band noise attenuation for the single-stage case:

$$D_{2nd}(z=1)' = -2\epsilon_1 + \epsilon_2 \quad \sigma_{D2} = 0.01\sqrt{5} = 0.022 (-33 \text{ db limit}) \quad (9)$$

$$D_{4th}(z=1)' = -4\epsilon_1 + 6\epsilon_2 - 4\epsilon_3 + \epsilon_4 \quad \sigma_{D2} = 0.01\sqrt{69} = 0.083 (-22 \text{ db limit}) \quad (10)$$

Therefore, increasing order of the singe stage filter actually reduces attenuation of quantization noise in the presence of gain errors. Experience shows that this level of sensitivity in practical implementations limits the single stage RTF modulator to attenuations on the order of 40 dB, which is best achieved with orders less than 3. The cascaded RTF arrangement of the invention allows greater attenuation of quantization noise, and larger loop filter orders, and reduces the sensitivity of the noise shaping characteristic to gain and phase errors.

In comparison with the single-stage, fourth-order system analyzed above, a 2-stage cascaded implementation of the loop filter produces the denominator term $$D_{4th}(z)' = [1 - 2(1+\epsilon_2)z^{-1} + z^{-2}] \cdot [1 - 2(1+\epsilon_3)z^{-1} + (1+\epsilon_4)z^{-2}] \quad (11)$$

As before, substituting and letting $\epsilon_i$ be an independent random variable with $\sigma_\epsilon = 0.01$, the residues are given by the following calculation of center band noise attenuation:

$$D_{4th}(z)' = [-2\epsilon_1 + \epsilon_2][1 - 2z^{-1} + z^{-2}] + [1 - 2z^{-1} + \quad (12)$$

$$z^{-2}][-2\epsilon_3 + \epsilon_4] + [-2\epsilon_1 + \epsilon_2][-2\epsilon_{3,4}]$$

$$\sigma_{D2} = [.01\sqrt{5}]^2 = .00048 (-66 \text{ dB limit})$$

Therefore, increasing order by adding cascade sections is shown to produce significant improvements in the achievable quantization noise attenuation in the presence of realistic gain errors. By viewing the errors $\epsilon_i$ as functions of frequency which have both gain and phase components, it can also be said that a significant reduction to phase errors is also obtained. Indeed, a single stage fourth order RTF would require gain errors on the order of $6\times10^{-3}\%$ to match the performance of the 2 stage cascade fourth order RTF with 1% gain errors.

This also applies to higher order C-RTF structures which employ other types of weighting, including IIR designs. In general, no more than three taps should be employed in each B section (regenerative feedback weighting). The A sections (feedforward weighting) are less critical, and can be factored and arranged in any combination. The improvement in sensitivity results from the fact that the resonator denominator transfer function is a product of sections.

A drawback of the cascaded architecture according to the invention by comparison with the direct form is the increase of parasitic delay in the primary loop. The latency associated with sum-split operations of each stage combines with the latency of the A/D-DAC to form the total parasitic latency of the loop. This establishes the lower limit on the transversal delay, $T_e$, and in turn sets the maximum attainable periodic frequency $f_e$. The noise shaping function produces attenuation over a bandwidth in relation to $f_e$, as a digital stop band filter does in relation to its sampling rate. When the periodic frequency ratio (PFR=$f_e/f_{bw}$) is increased, the noise shaping attenuation also increases.

A particular preferred embodiment of the invention is represented by the signal flow graph of FIG. 4a. In the embodiment of FIG. 4a, the C-RTF implements a two-stage, fourth-order cascade in which the preferred weighting is based upon a Chebychev Type II discrete-time high-pass filter prototype. The filter design parameters are: Order=four (five coefficients, $a_0$ to $a_4$ and $b_0$ to $b_4$, where $b_0$ is always unity); ripple=−85 dB; band edge given as a function of fe/2 is 0.07. A transversal delay is selected to be five nanoseconds (nsec) so that $f_e$=200 MHz. The IF frequency is selected to be 100 MHz. This IF frequency is obtained with the selected transversal period using the above prototype stop-band filter coefficients by multiplying the coefficients by $(-1)^n$ for n=0, 1, 2, . . . (the subscripted index of the coefficients). The single-stage weights, after mapping the coefficients to the single-stage RTF weights as described above, are: $Ar_1$, $Ar_2$, $Ar_3$, and $Ar_4$ equal −3.2712, −5.2660, −3.7936, and −0.97224, respectively, and $Br_1$, $Br_2$, $Br_3$, and $Br_4$ are equal to −3.9517, −5.9037, −3.9517, and −1.0000, respectively. The table of FIG. 10 lists the RTF weights after factoring into the cascaded RTF values. The factoring may be by any known method for factoring the polynomial N(z) and D(z) into sections of specific order.

The arrangement of FIG. 4a may be related to that of FIG. 3 in terms of the actual or virtual outputs of corresponding stages. In FIG. 3, the input signal to filter half-section $298_{11}$ is the delta (Δ) signal, and the output signal of filter half-section $298_{11}$ at intermediate point $93_1$ is referred to as $d_1$. The output signal of the first feedforward stage $298_{12}$ (the output signal of output summer circuit $94_1$) is designated n1, the output signal from the second regenerative half-stage $298_{21}$ at point $93_2$ is designated $d_2$, and the output signal from the second feedforward stage $298_{22}$ at port $26_o$ is designated $n_2$.

When the above-described weights are applied to the preferred embodiment of FIGS. 3 and 4a, they define the desired open-loop gain and phase at the specified 100 MHz intermediate frequency (IF) at this IF, negative weight defines a 0° (or integer multiple of 360°) phase, and a positive weight defines a 180° phase shift with respect to the positive weight when the tap delay is one transversal period. When the tap delay is two transversal periods, the negative weight defines a −180° phase and the positive weight defines a 0° shift. The phase slopes are defined according to the value of the tap delay specified by the structure, assuming that the transversal period is 5 nsec. In the case of phase nonlinearity, as produced, for example, by the AC coupling established by capacitors 412 and other capacitors in FIGS. 4a and 4b, the value of the actual transversal delay in a particular path may be modified to allow the correct phases to be obtained at 100 MHz. This modification, however, is typically less than 10% of the total delay. When the gain and phase alignment for the open-loop paths are satisfied, the noise shaping shown in plot 420 of FIG. 4c is obtained from the closed loop for suppressing the noise added by ADC 36 appearing at output $40_o$ of FIG. 1. Plot 422 of FIG. 4c represents the same as 420 in the absence of sampling and reconstruction by the ADC 36 and DAC 38, which may be referred to as "aliasing" effects. Plot 424 of FIG. 4c shows the closed-loop signal transfer function between input port 12 and output port 40° of FIG. 4a.

Figure 5A:
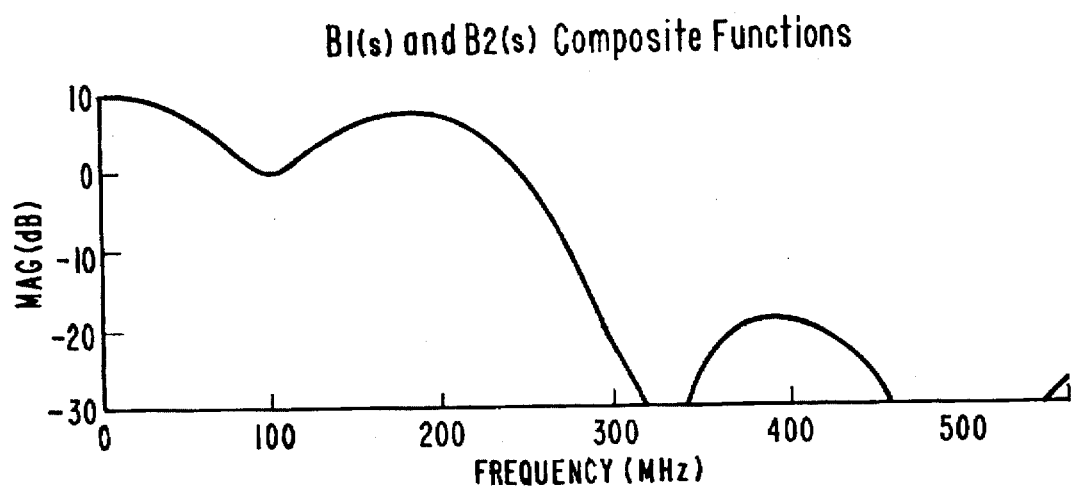
FIG. 5a plots the open-loop gain versus frequency of the loop of FIG. 4a, with an open regenerative open.
Figure 5B:
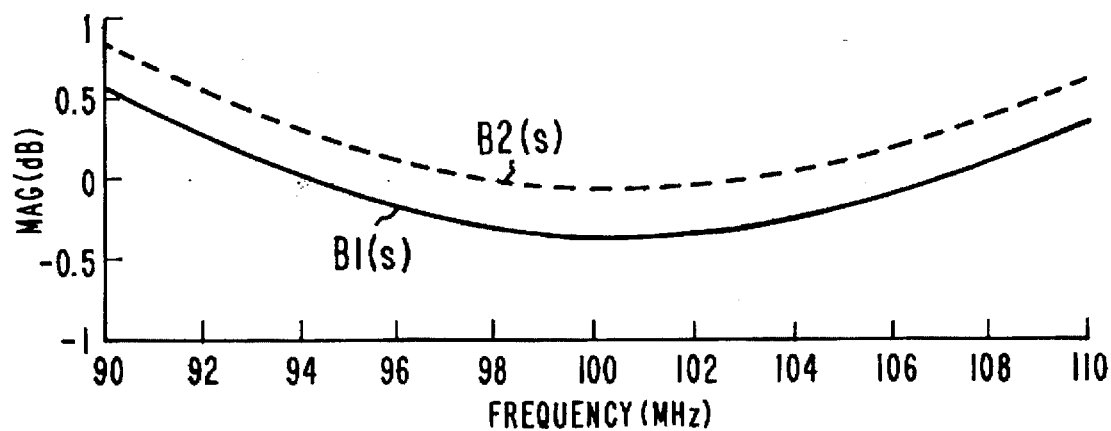
Figure 5C:
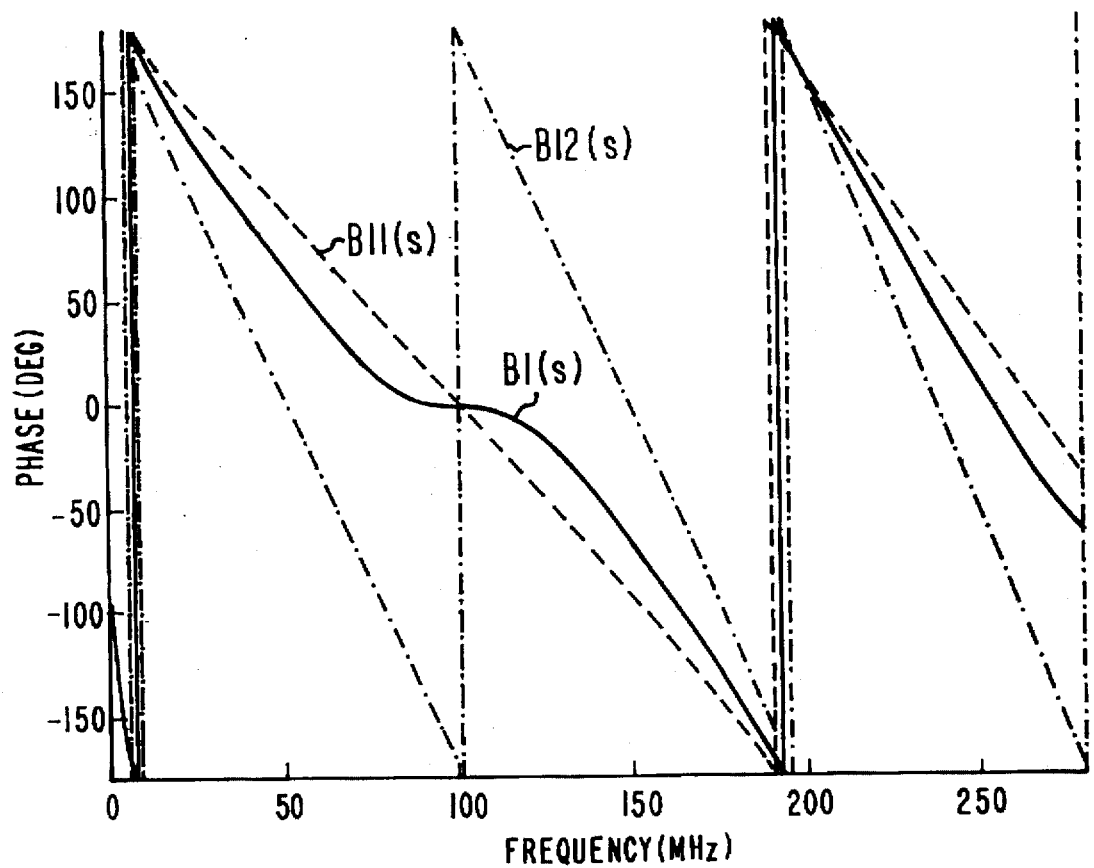
Figure 6A:
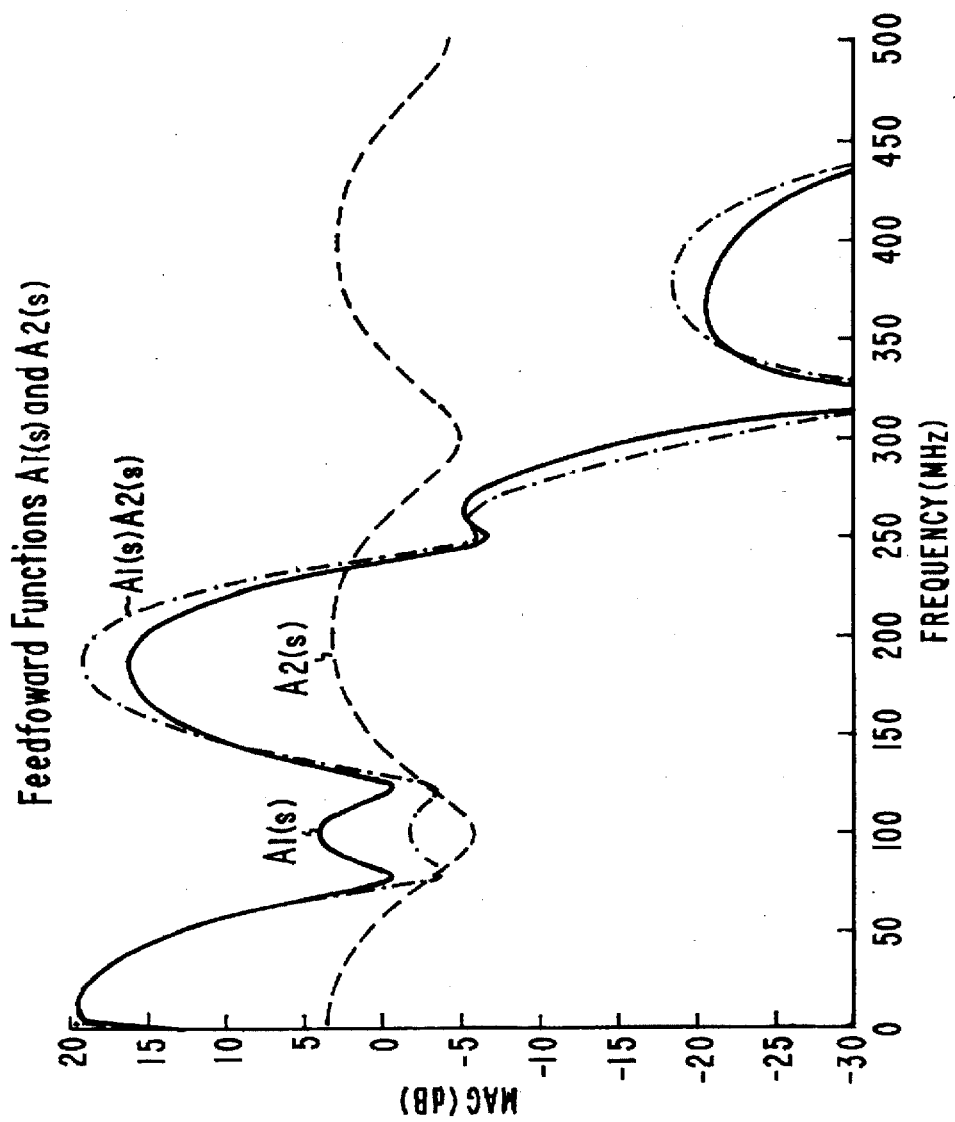
FIG. 6a is a plot of gain versus frequency of the feedforward paths of the arrangement of FIG. 4a when the loop is opened at path 16.
Figure 6B:
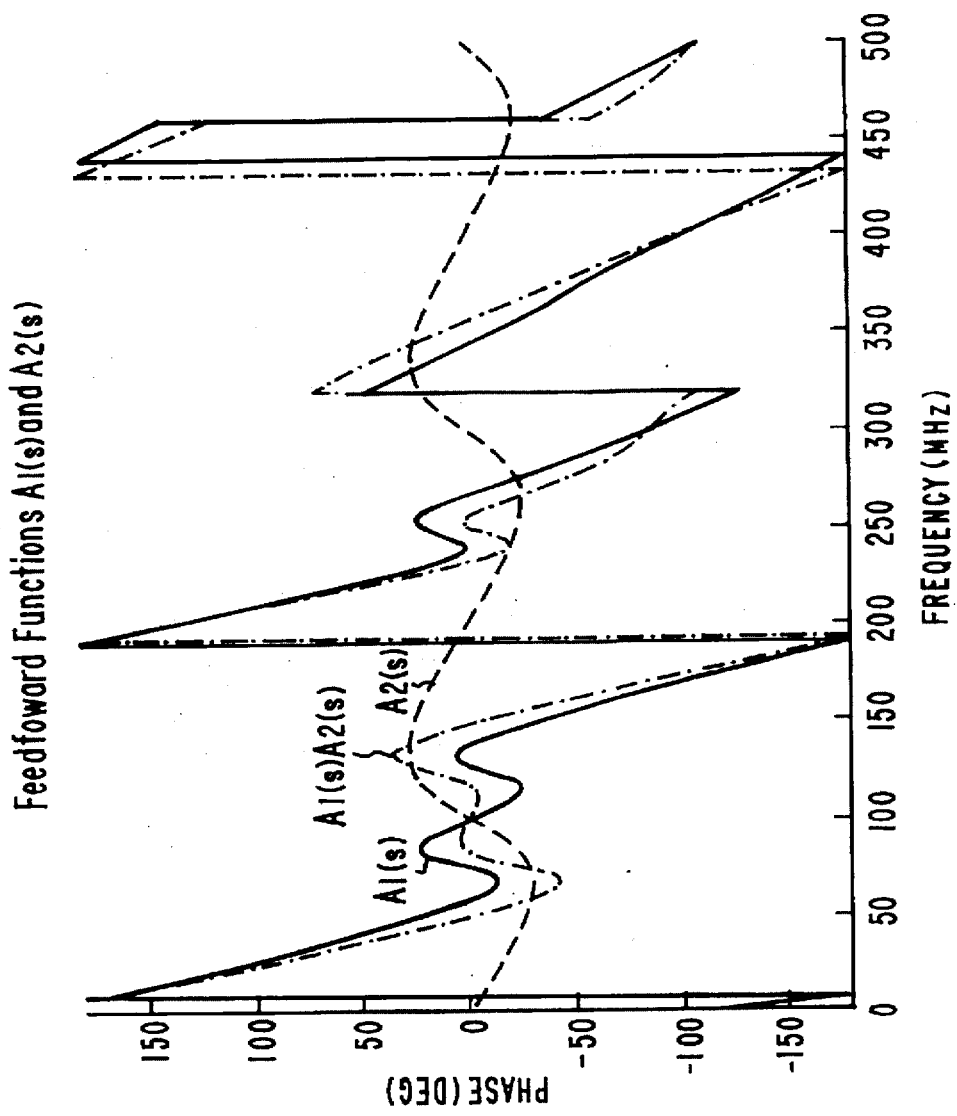
FIG. 6b is the corresponding phase response.
Figure 7:
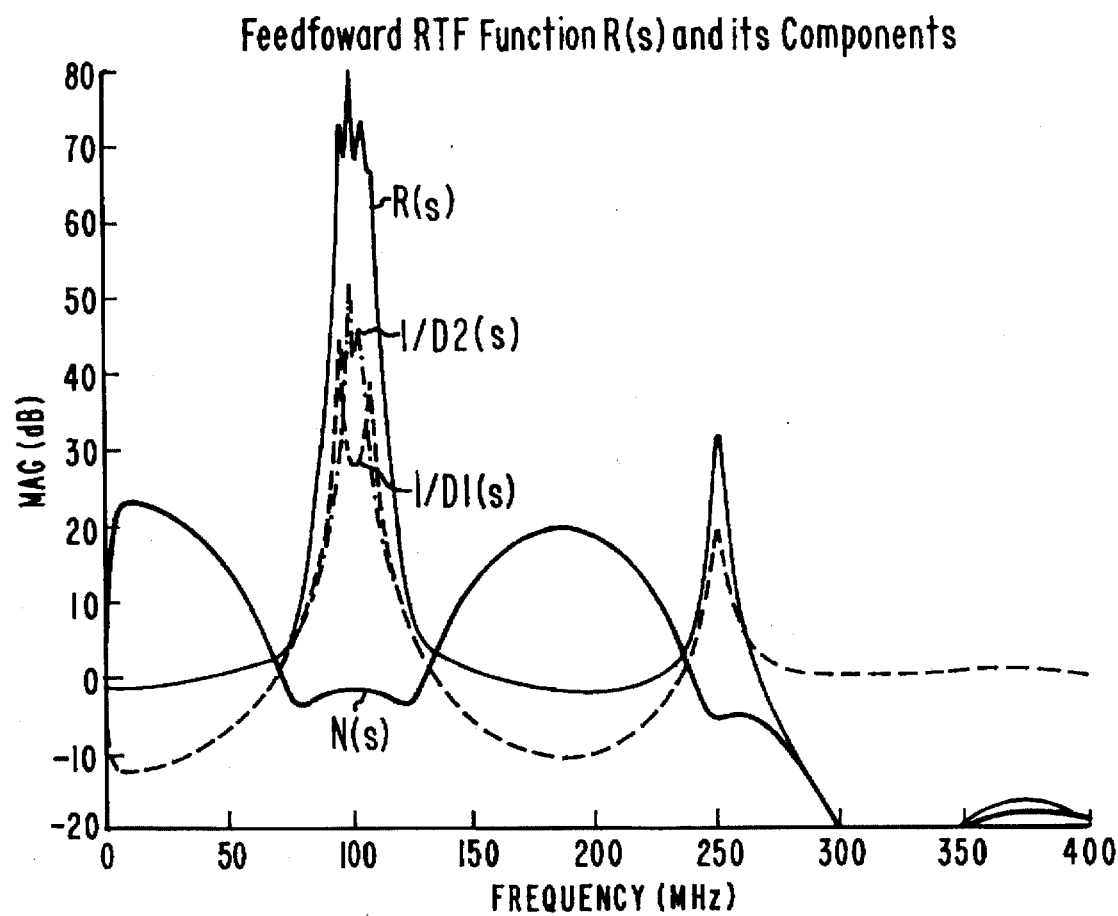
FIG. 7 is a plot of loop gain versus frequency for the arrangement of FIG. 4a with the main loop open and all other loops closed.
Figure 8:
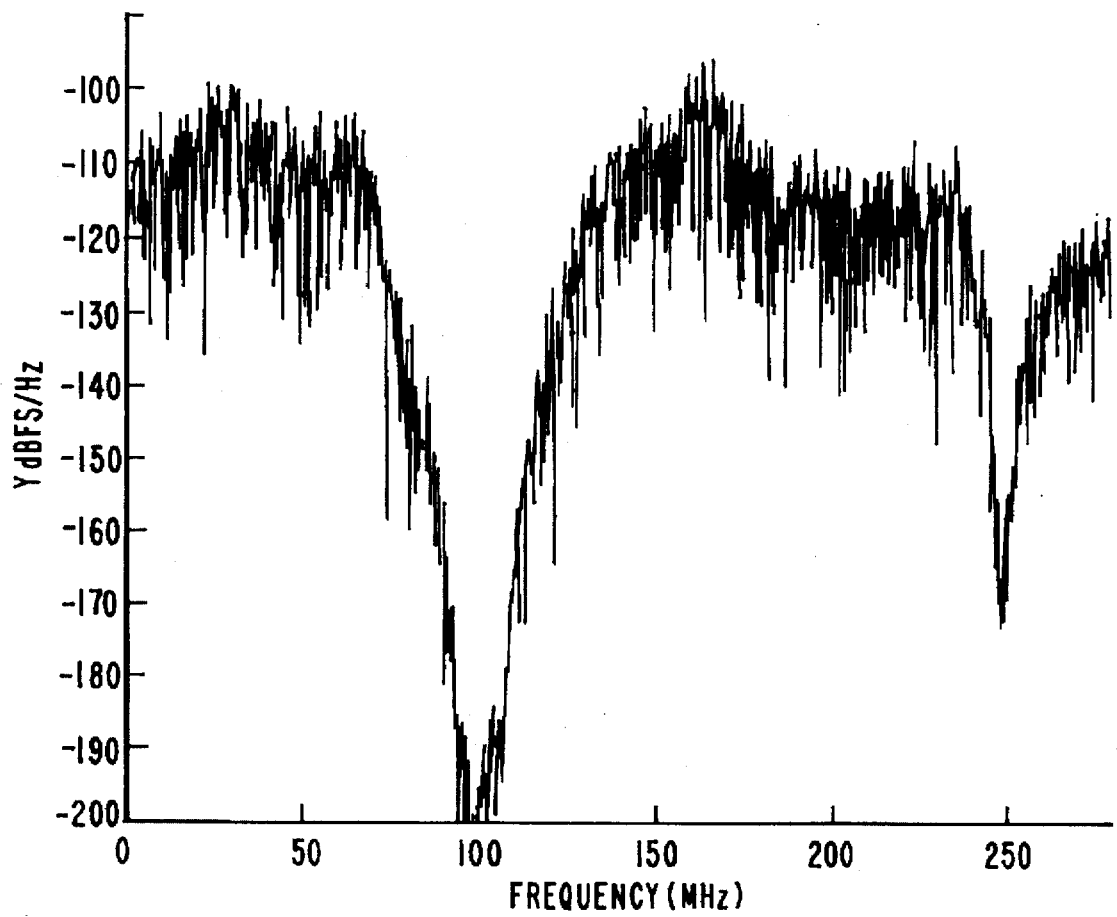
FIG. 8 is a computer-generated plot of a simulation of the digitized output of the arrangement of FIG. 4a in the absence of input signal.

To further illustrate the principles of the invention, FIG. 5a shows the open-loop transfer function or combined gain and phase response of an arrangement according to the invention, when the whole loop filter is present, but path $298_1$ of FIG. 4a is open. The combined gain response is near 0 dB at 100 MHZ. FIG. 5b is a detail of the plot of FIG. 5a, for the $B_{11}$ and $B_{12}$ loop ($B_1(s)$) and for the $B_{21}$ and $B_{22}$ loop ($B_2(s)$). FIG. 5c illustrates phase versus frequency of the combined regenerative loops $B_{11}$ and $B_{12}$, showing a flat near-0° region around the noise shaping band of 100 MHz. Similarly, FIGS. 6a and FIGS. 6b show the gain and phase responses of the feedforward sections, respectively. These also show the required frequency response as a whole with the loop filters present. FIG. 7 shows the resonator transfer function R(s) as a result of closing the loops in the RTF. This function has a high gain region in the noise shaping band as shown even in the presence of 1% gain and phase errors. This high gain is directly responsible for the attenuation in the same band of FIG. 4c plot 420. A simulation of this design has produced a digitized output with the spectrum shown in FIG. 8, demonstrating the deep null region in the quantization noise at 100 MHz, as expected. The indicated noise level which is approximately −190 dBFS/Hz would produce a 120 dB full scale signal to noise ratio (SNR) over a 10 MHz bandwidth. This is equivalent to the performance of a 19 bit (effective) 20 MHz sampling rate conventional ADC. Estimates of the performance level when the DAC 38 of FIG. 1 has a linearity of 0.08% and the CRTF of the same FIGURE has a noise figure of 10 dB is equivalent to 17 bits (effective) at a 20 MHz sampling rate.

As stated above, the arrangement of FIG. 4a may be related to FIG. 3 in terms of the actual or virtual outputs of corresponding stages. In FIG. 3, the input will be referred to as the delta signal or Δ and its output at $93_1$ is referred to as node d1. The first feedforward stage output is node n1, the second regenerative feedback stage output node $93_2$ is referred to as $d_2$, and the second feedforward stage output is output $26_o$, designated n2.

Figure 9A:
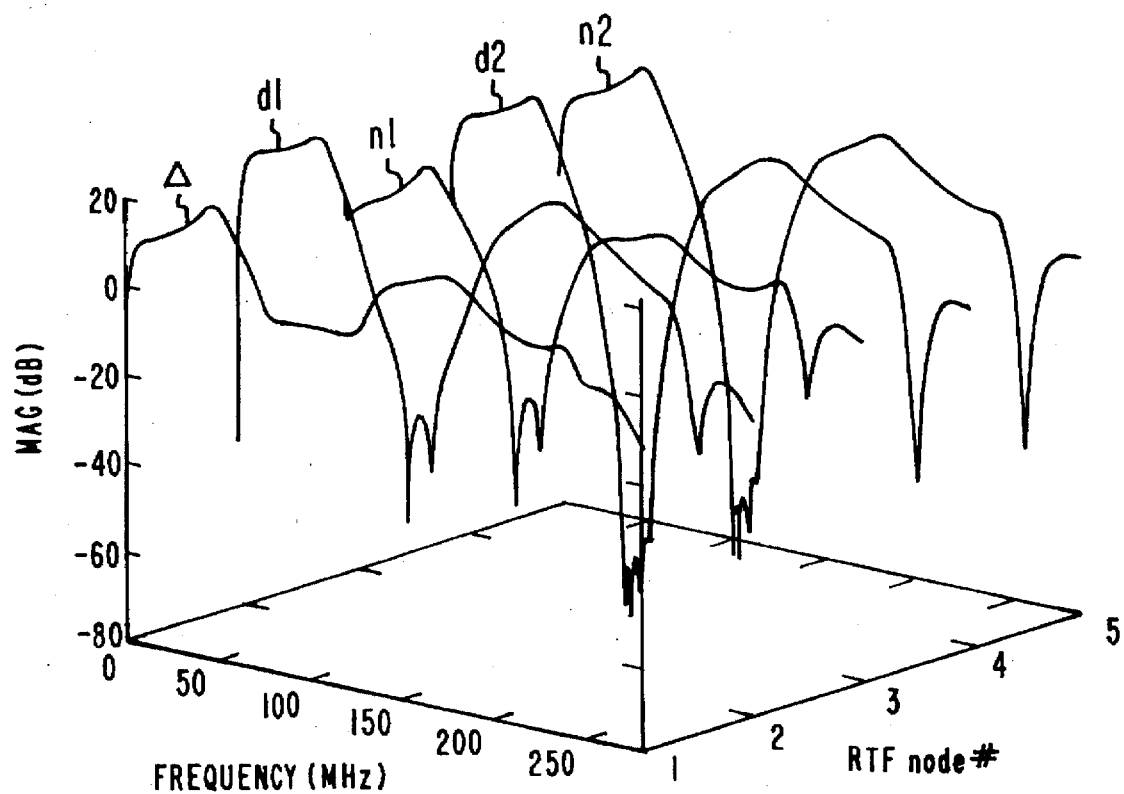
FIGS. 9a and 9b are plots of nodal transfer functions of the arrangement of FIGS. 3 and 4a, and FIG. 9c is a table listing mean values of the plots of FIGS. 9a and 9b over the noise-shaping band.

To further illustrate the benefits of the invention, in FIG. 3, intermediate transfer functions are defined between the nodes within the loop filter and the digitized output port $40_o$ of FIG. 4a. These are referred to as Nodal error transfer functions, which show the transfer of noise and error signals that are added unavoidably within the loop filter as a result noise and distortion of the active components used within. All of the internal error signals may be related to input equivalent errors. Therefore, the error added by the first stage of the loop filter is added at the delta or Δ node, the error of the second stage is added at the d1 node, and so on. These transfer functions, shown in FIG. 9a, show that in the noise shaping band, the noise added by the first stage received a 0 dB gain while subsequent stages show significant attenuation.

Figure 9B:
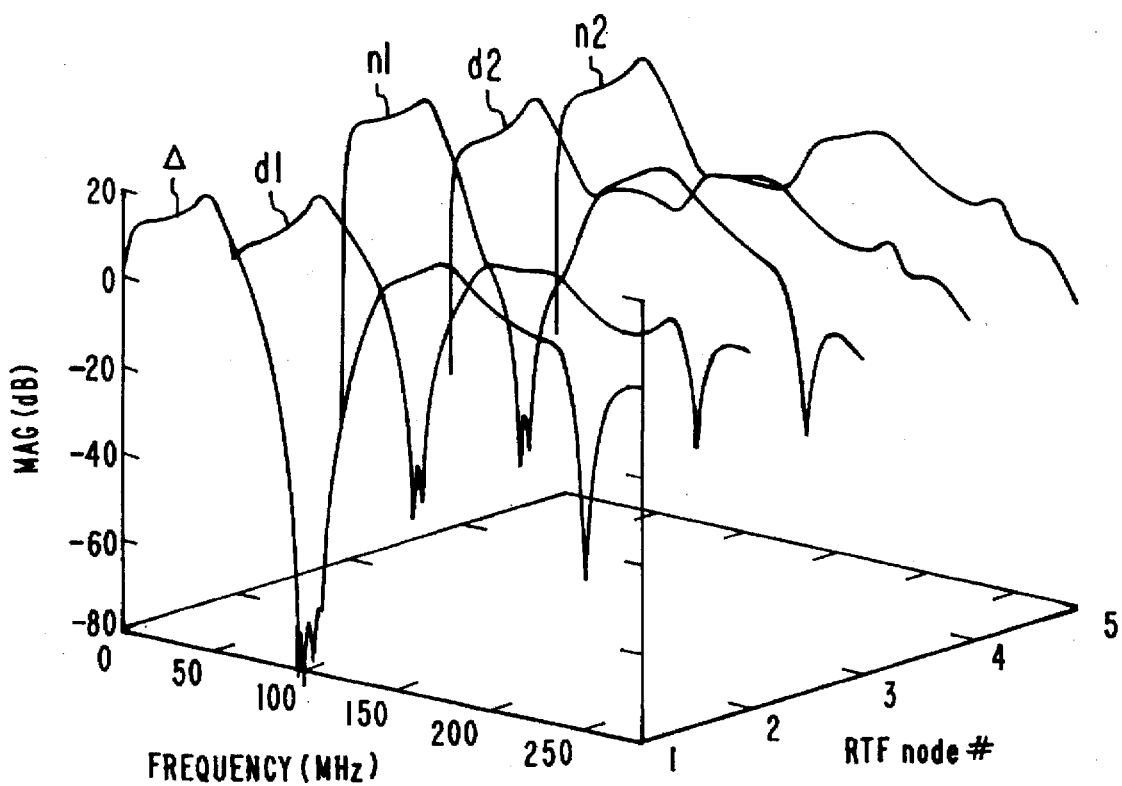

Additionally, intermediate transfer functions are defined between the input at port 12 of FIG. 4a and the nodes within the loop filter. These are referred to as nodal signal transfer functions, which show the transfer gains on the input signal to the various nodes. The nodal signal transfer functions are used to indicate the magnitude of the signals to be supported by the active circuitry within each stage. These transfer functions, shown in FIG. 9b, show that in the noise shaping band, the signal is transferred to the delay Δ node with high attenuation and that the signal magnitude increases after the first stage at the d1 node, however, still significantly attenuated. FIG. 9c tabulates the mean gains over the noise shaping band, specified between 95 MHz and 105 MHz, at these nodes. In observance of FIGS. 9a to 9c, the input stage of the C-RTF is shown to produce noise that is not attenuated at the output, but needs to support signals that are much smaller than the input. Conversely, the subsequent stages produce highly attenuated noise at the output, but must support larger signals than in the first stage. Therefore, it is preferential to optimize the first stage for low noise, even at the expense of dynamic range, while noise is of much less concern in the subsequent stages. This greatly simplifies the design in terms of optimization for high SNR.

According to an aspect of the invention as described above, a sigma-delta analog-to-digital converter (10) comprises an input summer stage (14) including an input port (12) coupled to receive analog signals to be converted into the desired digital output signals, and also includes an output port ($14_o$), for summing the analog signals to be converted with an analog representation of the digital output signal of the sigma-delta analog-to-digital converter (10), for thereby producing difference signals. An analog-to-digital converter (36) has an input port ($36i$) for receiving filtered difference signals, and also includes an output port (40), for converting the filtered difference signals into the desired digital output signal at the output port (40) of the analog-to-digital converter. A digital-to-analog converter stage (38) is coupled to the output port (40) of the analog-to-digital converter and to the input summer stage (14), for converting the desired digital output signal into the analog representation of the desired digital output signals. The sigma-delta analog-to-digital converter (10) also includes a multistage loop filter (26) coupled to the output port ($14_o$) of the input summer stage (14) for receiving the difference signals therefrom. The loop filter (26) includes a plurality of cascaded filter stages ($98_1, \ldots, 98_M$), all but one ($98_2$ of FIG. 2) of the cascaded filter stages includes first ($298_{11}$) and second ($298_{12}$) cascaded half-stages. The one of the cascaded filter stages ($98_2$) includes at least one filter half-stage ($298_{21}$). The last one ($298_{22}$) of the cascaded filter half-stages is coupled to the input port ($36i$) of the analog-to-digital converter stage (36) for coupling the filtered difference signals thereto. Each of the first half-stages of filter ($298_{11}$; $298_{21}$) includes an input summing circuit ($96_1$; $96_2$), and each input summing stage includes an output port ($96_{1o}$; $96_{2o}$), and each also includes an input port coupled for receiving signal to be filtered from a preceding stage, for summing the signal to be filtered with at least one weighted, delayed signal fed back from the output port ($96_{1o}$; $96_{2o}$) of the input summing circuit ($96_1$; $96_2$), for generating a shaped signal at the output port ($14_o$) of the input summing circuit (14). Each of the second half-stages ($298_{12}$; $298_{22}$) includes an output summing circuit ($94_1$; $94_2$) including at least two input ports coupled to receive at least two mutually delayed shaped signals from a preceding stage, for summing the mutually delayed shaped signals.

More particularly, a converter according to the invention as described above includes first ($98_1$) and second ($98_2$) cascaded filter stages in the multistage loop filter (26). The first ($98_1$) cascaded filter stage includes first ($298_{11}$) and second ($298_{12}$) cascaded half-stages of filter, and the second ($98_2$) cascaded filter stage includes first ($298_{21}$) and second ($298_{22}$) half-stages of filter. The first half-stage of filter ($298_{11}$) of the first cascaded filter stage ($98_1$) includes a tapped delay ($252_{111}$; $252_{112}$) coupled to the output port ($96_{1o}$) of the input summing circuit ($96_1$) of the first half-stage of filter ($298_{11}$) of the first cascaded filter stage ($98_1$), for generating delayed feed signals. The first half-stage of filter ($298_{11}$) of the first cascaded filter stage ($98_1$) further includes a weighting arrangement ($B_{11}$; $B_{12}$) coupled to an input port of the input summing circuit ($96_1$) and to the tapped delay ($252_{111}$; $252_{112}$), for weighting the delayed feed signals, for thereby generating the weighted, delayed signal fed back from the output port ($96_{1o}$) of the input summing circuit ($96_1$). The second half-stage of filter ($298_{12}$) of the first cascaded filter stage ($98_1$) includes the output summing circuit ($94_1$), which has at least first and second input ports. The second half-stage of filter ($298_{12}$) of the first cascaded filter stage ($98_1$) further includes first a weighting arrangement ($A_{11}$) coupled to the output port ($96_{1o}$) of the input summing circuit ($96_1$) of the first half-stage of filter ($298_{11}$) of the first cascaded filter stage ($98_1$) and to the first input port of the output summing circuit ($94_1$) of the second half-stage of filter ($298_{12}$) of the first cascaded filter stage ($98_1$), for coupling a weighted signal at a reference delay to the first input port of the output summing circuit ($94_1$) of the second half-stage of filter ($298_{12}$) of the first cascaded filter stage ($98_1$). The second half-stage of filter ($298_{12}$) of the first cascaded filter stage ($98_1$) includes a weighting circuit ($A_{12}$; $A_{13}$) coupled to the second input port of the output summing circuit ($94_1$) of the second half-stage of filter ($298_{12}$) of the first cascaded filter stage ($98_1$) and to the tapped delay ($252_{111}$; $252_{112}$), for weighting the delayed feed signals to generate weighted delayed signals for summing with the weighted signal at a reference delay, for generating the shaped signals at an output port of the output summing circuit ($94_1$) of the second half-stage of filter ($298_{12}$) of the first cascaded filter stage ($98_1$). The first ($298_{21}$) half-stage of filter of the second ($98_2$) cascaded filter stage includes a tapped delay ($252_{211}$; $252_{212}$) coupled to the output port ($96_{2o}$) of the input summing circuit ($96_2$) of the first half-stage of filter ($298_{21}$) of the second cascaded filter stage ($98_2$), for generating delayed feed signals. The first half-stage of filter ($298_{21}$) of the second cascaded filter stage ($98_2$) further includes a weighting arrangement ($B_{21}$; $B_{22}$) coupled to an input port of the input summing circuit ($96_2$) of the first ($298_{21}$) half-stage of filter of the second ($98_2$) cascaded filter stage and to the tapped delay ($252_{211}$; $252_{212}$) of the first ($298_{21}$) half-stage of filter of the second ($98_2$) cascaded filter stage, for weighting the delayed feed signals, for thereby generating the weighted, delayed signal fed back from the output port ($96_{2o}$) of the input summing circuit ($96_{22}$) of the first ($298_{21}$) half-stage of filter of the second ($98_2$) cascaded filter stage. The second half-stage of filter ($298_{22}$) of the second cascaded filter stage ($98_2$) includes an output summing circuit ($94_2$) including at least first and second input ports. The second half-stage of filter ($298_{12}$) of the second cascaded filter stage ($98_2$) further includes a first weighting arrangement ($A_{11}$) coupled to the output port ($96_{2o}$) of the input summing circuit ($96_2$) of the first half-stage of filter ($298_{21}$) of the second cascaded filter stage ($98_2$) and to the first input port of the output summing circuit ($94_2$) of the second half-stage of filter ($298_{22}$) of the second cascaded filter stage ($982_2$), for coupling a weighted signal at a reference delay to the first input port of the output summing circuit ($94_2$) of the second half-stage of filter ($298_{22}$) of the second cascaded filter stage ($98_2$). The second half-stage of filter ($298_{22}$) of the second cascaded filter stage ($98_2$) includes a weighting arrangement ($A_{22}$; $A_{23}$) coupled to the second input port of the output summing circuit ($94_2$) of the second half-stage of filter ($298_{22}$) of the second cascaded filter stage ($98_2$) and to the tapped delay ($252_{211}$; $252_{212}$) of the first ($298_{21}$) half-stage of filter of the second ($98_2$) cascaded filter stage, for weighting the delayed feed signals to generate weighted delayed signals for summing with the weighted signal at a reference delay, for generating the shaped signals at an output port of the output summing circuit ($94_2$) of the second half-stage of filter ($298_{22}$) of the second cascaded filter stage ($98_2$).

Other embodiments of the invention will be apparent to those skilled in the art. For example, an anti-alias filter may precede a sigma-delta analog-to-digital converter according to the invention, to limit the bandwidth of the analog signal being converted, in order to reduce aliasing or instability. The sigma-delta analog-to-digital converter may be followed by a decimator, if desired.

What is claimed is:

1. A sigma-delta analog-to-digital converter comprising:
    an input summer stage including an input port coupled to receive analog signals to be converted into the desired digital output signals, and also including an output port, for summing said analog signals to be converted with an analog representation of the digital output signal of said sigma-delta analog-to-digital converter, for thereby producing difference signals;
    an analog-to-digital converter having an input port for receiving filtered difference signals, and also including an output port, for converting said filtered difference signals into said desired digital output signal at said output port of said analog-to-digital converter;
    a digital-to-analog converter stage coupled to said output port of said analog-to-digital converter and to said input summer stage, for converting said desired digital output signal into said analog representation of said desired digital output signals;
    a multistage loop filter coupled to said output port of said input summer stage for receiving said difference signals therefrom, said loop filter including a plurality of cascaded stages, all but one of said cascaded stages including first and second cascaded half-stages, and said one of said stages including at least one half-stage, the last one of said cascaded half-stages being coupled to said input port of said analog-to-digital converter stage for coupling said filtered difference signals thereto, each of said first half-stages including an input summing circuit including an output port, and also including an input port coupled for receiving signal to be filtered from a preceding stage, for summing said signal to be filtered with at least one weighted, delayed signal fed back from said output port of said input summing circuit, for generating a shaped signal at said output port of said input summing circuit, each of said second half-stages including an output summing circuit including at least two input ports coupled to receive mutually delayed shaped signals from a preceding stage, for summing said mutually delayed shaped signals.

2. A converter according to claim 1, wherein
    said multistage loop filter includes first and second cascaded filter stages, said first cascaded filter stage including first and second cascaded half-stages of filter, and said second cascaded filter stage including first and second half-stages of filter, said first half-stage of filter of said first cascaded filter stage including a tapped delay coupled to said output port of said input summing circuit of said first half-stage of filter of said first cascaded filter stage, for generating delayed feed signals, said first half-stage of filter of said first cascaded filter stage further including weighting means coupled to an input port of said input summing circuit and to said tapped delay, for weighting said delayed feed signals, for thereby generating said weighted, delayed signal fed back from said output port of said input summing circuit;

said second half-stage of filter of said first cascaded filter stage including said output summing circuit including at least first and second ports, said second half-stage of filter of said first cascaded filter stage further including first weighting means coupled to said output port of said input summing circuit of said first half-stage of filter of said first cascaded filter stage and to said first input port of said output summing circuit of said second half-stage of filter of said first cascaded filter stage for coupling a weighted signal at a reference delay to said first input port of said output summing circuit of said second half-stage of filter of said first cascaded filter stage, said second half-stage of filter of said first cascaded filter stage including weighting means coupled to said second input port of said output summing circuit of said second half-stage of filter of said first cascaded filter stage and to said tapped delay, for weighting said delayed feed signals to generate weighted delayed signals for summing with said weighted signal at a reference delay, for generating said shaped signals at an output port of said output summing circuit of said second half-stage of filter of said first cascaded filter stage;

said first half-stage of filter of said second cascaded filter stage including a tapped delay coupled to said output port of said input summing circuit of said first half-stage of filter of said second cascaded filter stage, for generating delayed feed signals, said first half-stage of filter of said second cascaded filter stage further including weighting means coupled to an input port of said input summing circuit of said first half-stage of filter of said second cascaded filter stage and to said tapped delay of said first half-stage of filter of said second cascaded filter stage, for weighting said delayed feed signals, for thereby generating said weighted, delayed signal fed back from said output port of said input summing circuit of said first half-stage of filter of said second cascaded filter stage;

said second half-stage of filter of said second cascaded filter stage including said output summing circuit including at least first and second ports, said second half-stage of filter of said second cascaded filter stage further including first weighting means coupled to said output port of said input summing circuit of said first half-stage of filter of said second cascaded filter stage and to said first input port of said output summing circuit of said second half-stage of filter of said second cascaded filter stage for coupling a weighted signal at a reference delay to said first input port of said output summing circuit of said second half-stage of filter of said second cascaded filter stage, said second half-stage of filter of said second cascaded filter stage including weighting means coupled to said second input port of said output summing circuit of said second half-stage of filter of said second cascaded filter stage and to said tapped delay of said first half-stage of filter of said second cascaded filter stage, for weighting said delayed feed signals to generate weighted delayed signals for summing with said weighted signal at a reference delay, for generating said shaped signals at an output port of said output summing circuit of said second half-stage of filter of said second cascaded filter stage.

3. A sigma-delta analog-to-digital converter including an output port at which the desired digital signals are generated, said sigma-delta analog-to-digital converter comprising:

input summing means including a noninverting input port coupled to receive analog signals to be converted into digital signals, and an inverting input port coupled to receive reconstructed digital signals, to thereby produce difference signals;

a digital-to-analog converter coupled to said output port of said sigma-delta analog-to-digital converter and to said inverting input port of said input summing means, for converting said desired digital signals into said reconstructed digital signals;

a loop filter coupled to said input summing means for receiving said difference signals therefrom, and for filtering said difference signals with a frequency characteristic which includes N gain poles and N−1 gain zeroes, where N is an integer greater than one, to produce a resonated analog signal, said loop filter further including a cascade of a plurality M of feedback network stages, where M is greater than one, and P feedforward network stages, where P is at least one, each of said feedback network stages comprising a summer with a main input port and a summed signal output port, for receiving processed signal at said main input port from a preceding stage, and for, in the ith feedback stage, summing said processed signal with $N_i$ weighted, delayed versions of the signal appearing at said summed output port, where the sum of all $N_i$ for all stages equals N, and each of said feedforward network stages comprising a summer including a plurality of input ports and a summed signal output port, for, in the jth feedforward stage, receiving $L_j$ plural mutually delayed and weighted versions of processed signals from a preceding stage, and for summing together said $L_j$ mutually delayed and weighted versions in a feedforward manner, where the sum of all $L_j$ for all feedforward stages equals N−1; and analog-to-digital conversion means coupled to said loop filter and to said output port of said sigma-delta analog-to-digital converter, for converting said resonated analog signal into said desired digital signals at said output port of said sigma-delta analog-to-digital converter.

4. A sigma-delta analog-to-digital converter including an output port at which the desired digital signals are generated, said sigma-delta analog-to-digital converter comprising:

input summing means including a noninverting input port coupled to receive analog signals to be converted into digital signals, and an inverting input port coupled to receive reconstructed digital signals, to thereby produce difference signals;

a digital-to-analog converter coupled to said output port of said sigma-delta analog-to-digital converter and to said inverting input port of said input summing means, for converting said desired digital signals into said reconstructed digital signals;

a loop filter coupled to said input summing means for receiving said difference signals therefrom, and for filtering said difference signals with a frequency characteristic which includes a plurality of gain poles and a plurality of gain zeroes, to produce a resonated analog signal;

analog-to-digital conversion means coupled to said loop filter and to said output port of said sigma-delta analog-to-digital converter, for converting said resonated analog signal into said desired digital signals;

said loop filter including a cascade of a plurality of filter stages, each of said filter stages including (a) an input summer coupled for receiving stage output signals from a preceding one of said filter stages in the case of all of said filter stages except a first one of said filter stages, and for receiving said difference signals from said input summing means in the case of said first one of said filter stages, for combining the signals applied thereto with delayed, weighted feedback signals, to thereby produce stage intermediate signals;

(b) an output summer coupled for receiving weighted intermediate signals, for combining said weighted intermediate signals with delayed, weighted feedforward signals, to thereby produce said stage output signals;

(c) stage coupling means coupled to said input and output summers, for coupling said intermediate signals from said input summer to said output summer, and for weighting said intermediate signals applied to said output summer;

(d) delay means coupled to said stage coupling means for delaying said intermediate signals flowing in said stage coupling means, for generating at least one delayed intermediate signal;

(e) feedback signal weighting means coupled to said delay means and to said input summer for weighting said delayed intermediate signals for generating said delayed, weighted feedback signals; and at least one of said filter stages further including feedforward weighting means coupled to said delay means and to said output summer, for weighting said delayed intermediate signals, for generating said delayed, weighted feedforward signals.

5. A sigma-delta analog-to-digital converter including an output port at which the desired digital signals are generated, said sigma-delta analog-to-digital converter comprising:

input summing means including a noninverting input port coupled to receive analog signals to be converted into digital signals, and an inverting input port coupled to receive reconstructed digital signals, to thereby produce difference signals;

a digital-to-analog converter coupled to said output port of said sigma-delta analog-to-digital converter and to said inverting input port of said input summing means, for converting said desired digital signals into said reconstructed digital signals;

a loop filter coupled to said input summing means for receiving said difference signals therefrom, and for filtering said difference signals with a frequency characteristic which includes N gain poles and N−1 gain zeroes, where N is an integer greater than one, to produce a resonated analog signal, said loop filter further including M cascaded filter stages, where M is an integer not smaller than two and not larger than N, at least the ith one of said M filter stages including (a) an input summer coupled, in the case of the first one of said M stages, receiving said difference signals from said input summing means, and in the case of filter stages other than said first one of said filter stages, receiving output signals from a preceding one of said filter stages, for summing said one of said difference signals and said output signals from a preceding one of said stages with weighted, delayed feedback signals, to thereby produce stage intermediate signals;

(b) an output summer coupled for receiving weighted intermediate signals, for combining said weighted intermediate signals with delayed, weighted feedforward signals, to thereby produce said stage output signals;

(c) stage intermediate coupling means coupled to said input and output summers, for coupling said intermediate signals from said input summer to said output summer, and for weighting said intermediate signals to produce said weighted intermediate signals for application to said output summer;

(d) delay means coupled to said stage intermediate coupling means for delaying said intermediate signals flowing in said stage intermediate coupling means, for generating $N_i$ delayed intermediate signals, where i designates the ith stage of said cascade of filter stages, and $N_i$ is an integer no less than one, and where the sum of the values of $N_i$ is N;

(e) feedback signal weighting means coupled to said delay means and to said input summer for weighting said delayed intermediate signals for generating said delayed, weighted feedback signals for application to said input summer;

(f) feedforward signal weighting means coupled to said delay means and to said output summer, for weighting said delayed intermediate signals for generating said weighted feedforward signals for application to said output summer;

and, when M is greater than two, at least an other of said M filter stages including said input summer, said delay means, and said feedback weighting means, but not including said feedforward signal weighting means or said output summer, whereby the output of said other of said stages is the output of said stage intermediate coupling means; and analog-to-digital conversion means coupled to said loop filter and to said output port of said sigma-delta analog-to-digital converter, for converting said resonated analog signal into said desired digital signals at said output port of said sigma-delta analog-to-digital converter.

* * * * *